United States Patent
Wu et al.

(10) Patent No.: US 12,049,696 B2
(45) Date of Patent: Jul. 30, 2024

(54) PLASMA RESISTANT PROCESS CHAMBER LID

(71) Applicant: Applied Materials, Inc., Santa clara, CA (US)

(72) Inventors: Xiaowei Wu, San Jose, CA (US); Jennifer Y. Sun, Fremont, CA (US); Michael R. Rice, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 340 days.

(21) Appl. No.: 17/344,854

(22) Filed: Jun. 10, 2021

(65) Prior Publication Data

US 2021/0301395 A1    Sep. 30, 2021

Related U.S. Application Data

(60) Continuation of application No. 16/546,900, filed on Aug. 21, 2019, which is a division of application No.
(Continued)

(51) Int. Cl.
*C23C 14/00* (2006.01)
*C23C 14/08* (2006.01)
(Continued)

(52) U.S. Cl.
CPC .......... *C23C 16/405* (2013.01); *C23C 14/083* (2013.01); *C23C 16/403* (2013.01); *C23C 16/45542* (2013.01); *C30B 29/16* (2013.01); *C30B 29/68* (2013.01); *H01J 37/32477* (2013.01); *H01L 21/02192* (2013.01); *H01L 21/0228* (2013.01); *H01L 21/67161* (2013.01);
(Continued)

(58) Field of Classification Search
None
See application file for complete search history.

(56) References Cited

U.S. PATENT DOCUMENTS 5,630,314 A   5/1997   Kojima et al.
5,805,973 A   9/1998   Coffinberry
(Continued)

FOREIGN PATENT DOCUMENTS

CN   101577211 A   11/2009
CN   104711541 A    6/2015
(Continued)

OTHER PUBLICATIONS

Johansson, P. et al., "Atomic Layer Deposition Process for Barrier Applications of Flexible Packaging," 2010 Place Conference, Apr. 18-21, 2010, 33 pages, Albequerque, New Mexico.
(Continued)

*Primary Examiner* — Mandy C Louie
(74) *Attorney, Agent, or Firm* — Lowenstein Sandler LLP

(57) ABSTRACT

A lid or other chamber component for a process chamber comprises a) at least one surface comprising a first ceramic material, wherein the first ceramic material comprises $Y_3Al_5O_{12}$ and b) an internal region beneath the at least one surface comprising a second ceramic material, wherein the second ceramic material comprises a combination of $Al_2O_3$ and $ZrO_2$.

17 Claims, 19 Drawing Sheets

Related U.S. Application Data

15/947,402, filed on Apr. 6, 2018, now Pat. No. 10,443,126.

(51) Int. Cl.
| | |
|---|---|
| *C23C 16/40* | (2006.01) |
| *C23C 16/455* | (2006.01) |
| *C30B 29/16* | (2006.01) |
| *C30B 29/68* | (2006.01) |
| *H01J 37/32* | (2006.01) |
| *H01L 21/02* | (2006.01) |
| *H01L 21/67* | (2006.01) |
| *H01L 23/29* | (2006.01) |
| *H10N 60/85* | (2023.01) |

(52) U.S. Cl.
CPC ......... *H01L 23/291* (2013.01); *H10N 60/855* (2023.02)

(56) References Cited

U.S. PATENT DOCUMENTS

| | | | |
|---|---|---|---|
| 5,840,434 A | 11/1998 | Kojima | |
| 6,139,983 A | 10/2000 | Ohashi | |
| 6,548,424 B2 | 4/2003 | Putkonen | |
| 6,632,549 B1 | 10/2003 | Ohashi et al. | |
| 6,641,941 B2 | 11/2003 | Yamada et al. | |
| 6,685,991 B2 | 2/2004 | Wataya et al. | |
| 6,777,353 B2 | 8/2004 | Putkonen | |
| 6,858,332 B2 | 2/2005 | Yamada | |
| 6,858,546 B2 | 2/2005 | Niinisto et al. | |
| 6,916,534 B2 | 7/2005 | Wataya et al. | |
| 7,138,192 B2 | 11/2006 | Yamada et al. | |
| 7,351,658 B2 | 4/2008 | Putkonen | |
| 7,384,438 B1 * | 6/2008 | Rosenflanz | C03C 14/004 |
| | | | 451/28 |
| 7,384,696 B2 | 6/2008 | Hayasaki et al. | |
| 7,498,272 B2 | 3/2009 | Niinisto et al. | |
| 7,560,376 B2 | 7/2009 | Escher et al. | |
| 7,569,280 B2 | 8/2009 | Hayasaki et al. | |
| 7,696,117 B2 | 4/2010 | Sun et al. | |
| 7,754,621 B2 | 7/2010 | Putkonen | |
| 7,780,786 B2 | 8/2010 | Mitsuhashi et al. | |
| 7,968,205 B2 | 6/2011 | Nakano et al. | |
| 7,998,883 B2 | 8/2011 | Putkonen | |
| 8,357,454 B2 * | 1/2013 | Kulkarni | C23C 28/3455 |
| | | | 416/214 R |
| 8,399,862 B2 | 3/2013 | Ohmi et al. | |
| 8,619,406 B2 | 12/2013 | Cho et al. | |
| 8,858,745 B2 | 10/2014 | Sun et al. | |
| 8,916,021 B2 | 12/2014 | Sun et al. | |
| 9,012,030 B2 | 4/2015 | Han et al. | |
| 9,090,046 B2 | 7/2015 | Sun et al. | |
| 9,343,289 B2 | 5/2016 | Sun et al. | |
| 9,394,615 B2 | 7/2016 | Sun et al. | |
| 9,440,886 B2 | 9/2016 | Sun et al. | |
| 9,551,070 B2 | 1/2017 | Chang et al. | |
| 9,617,188 B2 | 4/2017 | Sun et al. | |
| 9,617,633 B2 | 4/2017 | He et al. | |
| 9,633,884 B2 | 4/2017 | He et al. | |
| 10,858,741 B2 * | 12/2020 | He | C23C 16/045 |
| 11,180,847 B2 * | 11/2021 | Wu | C23C 16/45531 |
| 2002/0042165 A1 | 4/2002 | Putkonen | |
| 2002/0177001 A1 | 11/2002 | Harada et al. | |
| 2003/0029563 A1 | 2/2003 | Kaushal et al. | |
| 2003/0051811 A1 | 3/2003 | Uchimaru et al. | |
| 2003/0072882 A1 | 4/2003 | Niinisto et al. | |
| 2004/0023811 A1 | 2/2004 | Iijima | |
| 2004/0043149 A1 | 3/2004 | Gordon et al. | |
| 2004/0191545 A1 | 9/2004 | Han et al. | |
| 2005/0227118 A1 | 10/2005 | Uchimaru et al. | |
| 2006/0037536 A1 | 2/2006 | Kobayashi et al. | |
| 2006/0073354 A1 | 4/2006 | Watanabe et al. | |
| 2008/0066647 A1 | 3/2008 | Harada et al. | |
| 2008/0213496 A1 | 9/2008 | Sun et al. | |
| 2008/0264565 A1 * | 10/2008 | Sun | C23C 16/4404 |
| | | | 501/134 |
| 2009/0194233 A1 | 8/2009 | Tamura et al. | |
| 2010/0119843 A1 | 5/2010 | Sun et al. | |
| 2010/0119844 A1 | 5/2010 | Sun et al. | |
| 2010/0129670 A1 | 5/2010 | Sun et al. | |
| 2010/0136349 A1 | 6/2010 | Lee | |
| 2010/0323124 A1 | 12/2010 | Vartabedian et al. | |
| 2010/0327213 A1 * | 12/2010 | Tolpygo | C23C 28/345 |
| | | | 252/62 |
| 2011/0014359 A1 | 1/2011 | Hashim et al. | |
| 2011/0091700 A1 | 4/2011 | Simpson | |
| 2012/0103519 A1 | 5/2012 | Aheem | |
| 2012/0135155 A1 | 5/2012 | Han et al. | |
| 2012/0138472 A1 | 6/2012 | Han et al. | |
| 2013/0154059 A1 | 6/2013 | Ohmi et al. | |
| 2013/0196141 A1 | 8/2013 | Vassen et al. | |
| 2014/0116338 A1 | 5/2014 | He et al. | |
| 2014/0120312 A1 | 5/2014 | He et al. | |
| 2014/0377504 A1 | 12/2014 | Sun et al. | |
| 2015/0004418 A1 | 1/2015 | Sun et al. | |
| 2015/0021324 A1 | 1/2015 | Sun et al. | |
| 2015/0024155 A1 | 1/2015 | Sun et al. | |
| 2015/0061237 A1 | 3/2015 | Sun et al. | |
| 2015/0064450 A1 | 3/2015 | Sun et al. | |
| 2015/0152540 A1 | 6/2015 | Sato et al. | |
| 2015/0158775 A1 * | 6/2015 | Sun | C23C 14/5806 |
| | | | 428/332 |
| 2015/0299050 A1 | 10/2015 | Sun et al. | |
| 2015/0307982 A1 | 10/2015 | Firouzdor et al. | |
| 2015/0311043 A1 | 10/2015 | Sun et al. | |
| 2015/0311044 A1 | 10/2015 | Sun et al. | |
| 2015/0321964 A1 | 11/2015 | Sun et al. | |
| 2015/0329955 A1 | 11/2015 | Sun et al. | |
| 2016/0079040 A1 | 3/2016 | Park et al. | |
| 2016/0181627 A1 | 6/2016 | Roeder et al. | |
| 2016/0211121 A1 | 7/2016 | Sun et al. | |
| 2016/0273095 A1 | 9/2016 | Lin et al. | |
| 2016/0312351 A1 | 10/2016 | Liu et al. | |
| 2016/0326625 A1 | 11/2016 | Sun et al. | |
| 2016/0326626 A1 | 11/2016 | Sun et al. | |
| 2016/0332921 A1 | 11/2016 | Iwasawa | |
| 2016/0336210 A1 | 11/2016 | Cooke et al. | |
| 2016/0375515 A1 | 12/2016 | Xu et al. | |
| 2016/0379806 A1 * | 12/2016 | Xu | C23C 16/403 |
| | | | 156/345.43 |
| 2017/0022595 A1 | 1/2017 | Sato et al. | |
| 2017/0110293 A1 | 4/2017 | Sun et al. | |
| 2017/0140969 A1 | 5/2017 | Kuo et al. | |
| 2017/0314125 A1 | 11/2017 | Fenwick et al. | |
| 2018/0044800 A1 | 2/2018 | Hendrix et al. | |
| 2018/0209042 A1 | 7/2018 | Wu et al. | |
| 2018/0240648 A1 | 8/2018 | Wu et al. | |
| 2020/0080197 A1 | 3/2020 | Soininen et al. | |

FOREIGN PATENT DOCUMENTS

| | | | | |
|---|---|---|---|---|
| CN | 105225997 A | | 1/2016 | |
| CN | 105990081 | * | 10/2016 | ............ H01J 37/32 |
| JP | H03115535 A | | 5/1991 | |
| JP | 2006082474 A | | 3/2006 | |
| JP | 2007131951 A | | 5/2007 | |
| JP | 2007217782 A | | 8/2007 | |
| KR | 20170044396 A | | 4/2017 | |
| TW | 201621066 | * | 6/2016 | ............ C23C 4/18 |
| WO | 2013032260 A2 | | 3/2013 | |
| WO | 2015120265 A1 | | 8/2015 | |
| WO | WO-2022081700 A1 * | | 4/2022 | ............ B32B 18/00 |

OTHER PUBLICATIONS

Putkonen, M. et al. "Low-Temperature ALE Deposition of $Y_2O_3$ Thin Films from B-Diketonate Precursors", Chemical Vapor Deposition, 2001, vol. 7, No. 1, pp. 44-50, Verlag GmbH, Weinheim, Germany.

(56) References Cited

OTHER PUBLICATIONS

Pilvi, T. et al. "ALD of YF3 Thin Films from TiF4 and Y(thd)3 Precursors", Chemical Vapor Deposition, 2009, vol. 15, pp. 27-32, Verlag GmbH & Co., Weinheim, Germany.
Rowland, J.C. "Atomic Layer Depositions of the Al2O3-Y2O3 Pseudo-Binary System", Doctoral Disertation, University of Florida, ProQuest LLC, 2010, pp. 1-106.
Zirconia—An Overview: Science Direct Topics 2013 https://www.sciencedirect.com/topics/materials-science/zirconia (Year: 2013).

\* cited by examiner

PLASMA RESISTANT PROCESS CHAMBER LID

RELATED APPLICATIONS

This patent application is a continuation application of U.S. patent application Ser. No. 16/546,900 filed on Aug. 21, 2019, which is a divisional application of U.S. patent application Ser. No. 15/947,402 filed on Apr. 6, 2018, both of which are incorporated by reference herein.

TECHNICAL FIELD

Embodiments disclosed herein relate, in general, to rare-earth coatings for articles with an interruption layer, and in particular to yttrium oxide coatings with one or more interruption layers for controlling the yttrium oxide grain growth.

BACKGROUND

Various manufacturing processes expose semiconductor process chamber components to high temperatures, high energy plasma, a mixture of corrosive gases, high stress, and combinations thereof. These extreme conditions may erode and/or corrode the chamber components, increasing the chamber components' susceptibility to defects.

Protective coatings used for reducing defects on chamber components due to harsh processing conditions are typically deposited on chamber components. Protective coatings may be deposited by a variety of techniques, including but not limited to, thermal spray, sputtering, ion assisted deposition (IAD), plasma spray, evaporation techniques, atomic layer deposition, chemical vapor deposition, and so on. Some of these techniques may generate protective coatings with abnormally large crystal grains. Abnormally large crystal grains may increase the protective coating's surface roughness and provide a pathway for diffusion of chemicals through possible cracks between the grains or through grain boundaries.

SUMMARY

In an example embodiment, disclosed herein is an article comprising a plasma resistant protective coating on a surface of the article. The plasma resistant protective coating may comprise a stack of alternating layers of crystalline rare-earth oxide layers and crystalline or amorphous metal oxide layers. The first layer in the stack of alternating layers may be a crystalline rare-earth oxide layer. The crystalline rare-earth oxide layers may have a thickness of about 500-5000 angstroms. In embodiments where the metal oxide layers are crystalline, each of the metal oxide layers may have an atomic crystalline phase different from the crystalline phase of the rare-earth oxide layer and each metal oxide layer may have a thickness of about 1-500 angstroms. The crystalline or amorphous metal oxide layers may inhibit grain growth in the crystalline yttrium oxide layers.

In an example embodiment, disclosed herein is a method comprising depositing a plasma resistant protective coating onto a surface of an article using an atomic layer deposition (ALD) process or a chemical vapor deposition (CVD) process. Depositing the plasma resistant protective coating may comprise depositing a crystalline rare-earth oxide layer using ALD or CVD. Depositing the plasma resistant protective coating may further comprise depositing a crystalline or amorphous metal oxide layer on the crystalline rare-earth oxide layer using ALD or CVD. In embodiments where the metal oxide layer is crystalline, the metal oxide layer may have an atomic crystalline phase different from the crystalline phase of the crystalline rare-earth oxide.

In an example embodiment, disclosed herein is a method comprising depositing a plasma resistant protective coating onto a surface of an article using an atomic layer deposition (ALD) process or a chemical vapor deposition (CVD) process. Depositing the plasma resistant protective coating may comprise depositing a stack of alternating layers of crystalline yttrium oxide layers and crystalline or amorphous metal oxide layers. Each of the crystalline yttrium oxide layers may have a cubic phase and a thickness of about 500-5000 angstroms. In embodiments where the metal oxide layers are crystalline, the metal oxide layers may have an atomic crystalline phase different from the cubic phase of the crystalline yttrium oxide and each of the metal oxide layers may have a thickness of about 1-500 angstroms. The first layer in the stack of alternating layers may be a crystalline yttrium oxide layer. The crystalline or amorphous metal oxide layers may inhibit grain growth in the crystalline yttrium oxide layers.

BRIEF DESCRIPTION OF THE DRAWINGS

Embodiments of the present invention are illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1A:
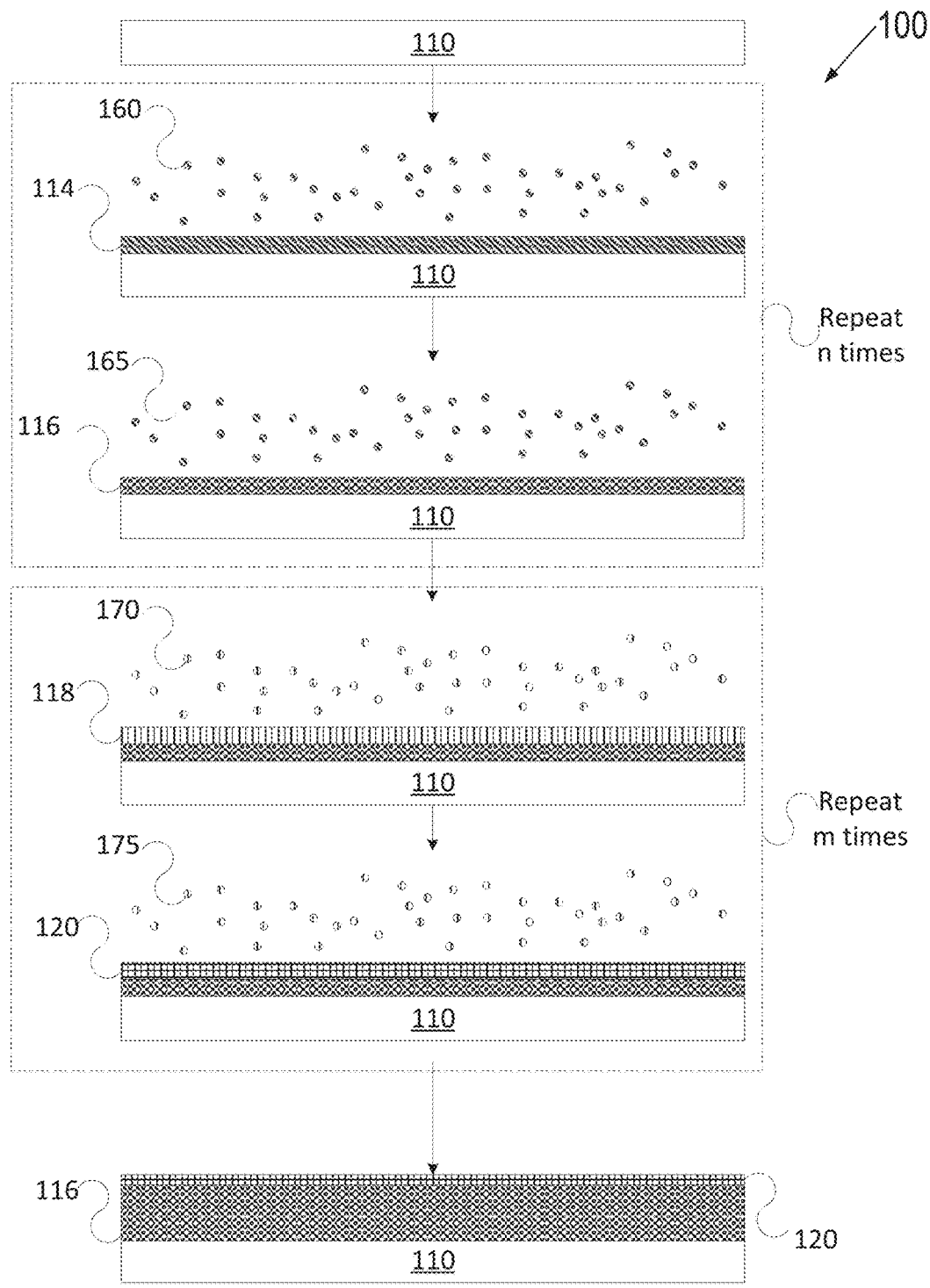
FIG. 1A depicts one embodiment of an atomic layer deposition process described herein.

Embodiments described herein cover articles (e.g., coated chamber components) and methods where a plasma resistant protective coating having one or more (poly)crystalline single phase or multiphase rare-earth oxide layers and one or more amorphous or (poly)crystalline single phase or multiphase interruption layers are deposited on a surface of an article. In an exemplary embodiment, the one or more crystalline rare-earth oxide layers may comprise crystalline yttrium oxide in a cubic phase. Embodiments herein are described with a crystalline yttrium oxide layer in a cubic phase as an example. It will be appreciated that the layer or layers between the interruption layers may include any rare earth metal oxide or mixtures of rare earth metal oxides (i.e., with or without yttrium) that are in a (poly)crystalline single phase or multiphase. For instance, the rare earth metal oxide layer(s) between the interruption layers may comprise yttrium oxide and/or yttrium zirconium oxide.

In an exemplary embodiment, the one or more amorphous or (poly)crystalline single phase or multiphase interruption layers may comprise a crystalline or amorphous metal oxide layer selected from the group consisting of rare-earth metal-containing oxides, zirconium oxide, aluminum oxide and mixtures thereof. In embodiments where the one or more interruption layers are (poly)crystalline single phase or multiphase, the interruption layers may have an atomic crystalline phase or a plurality of atomic crystalline phases that are different from the cubic phase of the crystalline yttrium oxide. For instance, a (poly)crystalline single phase or multiphase phase of the interruption layers may be selected from the group consisting of hexagonal phase, monoclinic phase, cubic phase (if the rare-earth oxide layer is yttrium oxide in the cubic phase, than the interruption layer may have a lattice structure that is different from the lattice structure of the cubic phase of the crystalline yttrium oxide), hexagonal phase, tetragonal phase, and combinations thereof.

As used herein, the term "plasma resistant" means resistant to one or more types of plasma as well as resistant to chemistry and radicals associated with the one or more types of plasma.

As used herein, the term "polycrystalline" and "crystalline" are used herein interchangeably and may mean a material that includes many crystalline grains (also referred to as crystallites) that are randomly oriented with respect to each other or have preferred orientation or texture, and which may have varying sizes. The areas where crystallites meet are referred to as grain boundaries. A polycrystalline layer may comprise a single crystal phase or a plurality of crystal phases (also referred to herein by the term "multiphase"). As used herein, it is understood that reference to a multiphase layer refers to a crystalline or polycrystalline layer having multiple crystal phases.

The surface of the article may be a metal material (e.g., such as an aluminum (e.g., Al 6061, Al 6063) and stainless steel) or a ceramic material (e.g., such as alumina ($Al_2O_3$)).

The deposition process may be an atomic layer deposition (ALD) process or a chemical vapor deposition (CVD) process. The ALD and CVD processes may be used for deposition of the one or more crystalline rare-earth oxide layers and of the one or more amorphous or crystalline metal oxide interruption layers. Layers that comprise more than one metal may be deposited through sequential deposition of precursors or through co-deposition of precursors.

The plasma resistant protective coating may be comprised of a bi-layer stack or of a plurality of alternating layers stack. The bi-layer stack or plurality of alternating layers stack may include one or more layers of crystalline single phase yttrium oxide ($Y_2O_3$), e.g., in a cubic phase, and one or more layers of multiphase zirconium oxide layer, e.g., in a tetragonal and monoclinic phase. The bi-layer stack or plurality of alternating layers stack may include one or more layers of crystalline single phase yttrium oxide ($Y_2O_3$), e.g., in a cubic phase, and one or more layers of crystalline single phase zirconium yttrium oxide layer, e.g., in a tetragonal phase. The bi-layer stack or plurality of alternating layers stack may include one or more layers of crystalline single phase yttrium oxide ($Y_2O_3$), e.g., in a cubic phase in a first lattice structure, and one or more layers of multiphase mixture of zirconium yttrium oxide layer, e.g., in a cubic phase with a second lattice structure, and yttrium oxide, e.g., in a cubic phase with a third lattice structure. The second and the third lattice structures being different from the first lattice structure.

The thickness of each interruption layer in the multi-layer plasma resistant protective coating may range from about 1 angstroms to about 500 angstroms. The thickness of each rare-earth oxide layer in the multi-layer plasma resistant protective coating may range from about 500 angstroms to about 10,000 angstroms. In some embodiments, the thickness of each rare-earth oxide layer in the multi-layer plasma resistant protective coating may range from about 500 angstroms to about 5000 angstroms. In embodiments, multi-layer plasma resistant protective coating may have a thickness of about 1 µm to about 10 µm, or about 1 µm to about 5 µm. The plasma resistant protective coating may coat or cover the surfaces of features in the article having high aspect ratios, e.g., of about 10:1 to about 300:1. The plasma resistant protective coating may also conformally cover such features with a substantially uniform thickness. In one embodiment, the plasma resistant protective coating has a conformal coverage of the underlying surface that is coated (including coated surface features) with a uniform thickness having a thickness variation from one part of the coating to another of less than about +/−20%, a thickness variation of +/−10%, a thickness variation of +/−5%, or a lower thickness variation. The plasma resistant protective coating is also very dense with a porosity of about 0% (e.g., the plasma resistant protective coating may be porosity-free in embodiments).

ALD allows for a controlled self-limiting deposition of material through chemical reactions with the surface of the article. Aside from being a conformal process, ALD is also a uniform process. All exposed sides of the article, including high aspect ratio features (e.g., about 10:1 to about 300:1) will have the same or approximately the same amount of material deposited. A typical reaction cycle of an ALD process starts with a precursor (i.e., a single chemical A) flooded into an ALD chamber and adsorbed onto the surface of the article. The excess precursor is then flushed out of the ALD chamber before a reactant (i.e., a single chemical R) is introduced into the ALD chamber and subsequently flushed out. The metal oxide interruption layer may, however, be formed by co-deposition of materials. To achieve this, a mixture of two precursors, such as a first metal-containing oxide precursor (A) and a second metal-containing oxide precursor (B), may be co-injected ($A_xB_y$) at any number of ratios, for example, A90+B10, A70+B30, A50+B50, A30+B70, A10+A90 and so on, into the chamber and adsorbed on the surface of the article. In these examples, x and y are expressed in molar ratios (mol %) for Ax+By. For example A90+B10 is 90 mol % of A and 10 mol % of B. Alternatively, the two precursors may be injected sequentially (without injecting a reactant in between). Excess precursors are flushed out. A reactant is introduced into the ALD chamber and reacts with the adsorbed precursors to form a solid layer before the excess chemicals are flushed out. For ALD, the final thickness of material is dependent on the number of reaction cycles that are run, because each reaction cycle will grow a layer of a certain thickness that may be one atomic layer or a fraction of an atomic layer.

CVD allows for deposition of a highly dense, pure, and uniform coating with good reproducibility and adhesion at high deposition rates. A typical reaction cycle of CVD may comprise: generating precursors from a starting material, transporting the precursors into a reaction chamber, absorbing the precursors onto a heated article, chemically reacting the precursor with the surface of the article to be coated to form a deposit and a gaseous by-product, and removing the gaseous by-product and unreacted gaseous precursors from the reaction chamber. The metal oxide interruption layer may, however, be formed by co-deposition of materials. To achieve this, a mixture of two precursors, such as a first metal-containing oxide precursor (A) and a second metal-containing oxide precursor (B), may be co-injected ($A_xB_y$) at any number of ratios, similarly to the ALD technique, into the chamber and deposited on the surface of the article.

Unlike other techniques typically used to deposit coatings on components having high aspect ratio features, such as plasma spray coating and ion assisted deposition, the ALD and CVD techniques can deposit a layer of material within such features (i.e., on the surfaces of the features). Additionally, the ALD and CVD techniques produce relatively thin (e.g., 10 µm or less) coatings that are porosity-free (i.e., pin-hole free), which may eliminate crack formation during deposition. The term "porosity-free" as used herein means absence of any pores, pin-holes, voids, or cracks along the whole depth of the coating as measured by transmission electron microscopy (TEM). The TEM may be performed using a 100 nm thick TEM lamella prepared by focused ion beam milling, with the TEM operated at 200 kV in bright-field, dark-field, and high-resolution mode. In contrast, with conventional e-beam IAD or plasma spray techniques, cracks form upon deposition even at thicknesses of 5 or 10 µm and the porosity may be 1-3% or even higher.

Plasma resistant protective coatings may be deposited on a variety of articles. In some embodiments, process chamber components, such as an electrostatic chuck, a nozzle, a gas distribution plate, a showerhead, an electrostatic chuck component, a chamber wall, a liner, a liner kit, a gas line, a lid, a chamber lid, a nozzle, a single ring, a processing kit ring, a base, a shield, a plasma screen, a flow equalizer, a cooling base, a chamber viewport, a bellow, a faceplate, selectivity modulating device, plasma generation units (e.g., radiofrequency electrodes with housings), and diffusers, would benefit from having these plasma resistant protective coatings to protect the components in harsh environments with corrosive plasmas. Many of these chamber components have high aspect ratios that range from about 10:1 to about 300:1 and other complex shapes which makes them difficult to coat well using conventional deposition methods. Embodiments described herein enable high aspect ratio articles such as the aforementioned process chamber components to be coated with plasma resistant protective coatings that protect the articles.

Examples of processing gases that may be used to process substrates in the processing chamber include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases).

Figure 1B:
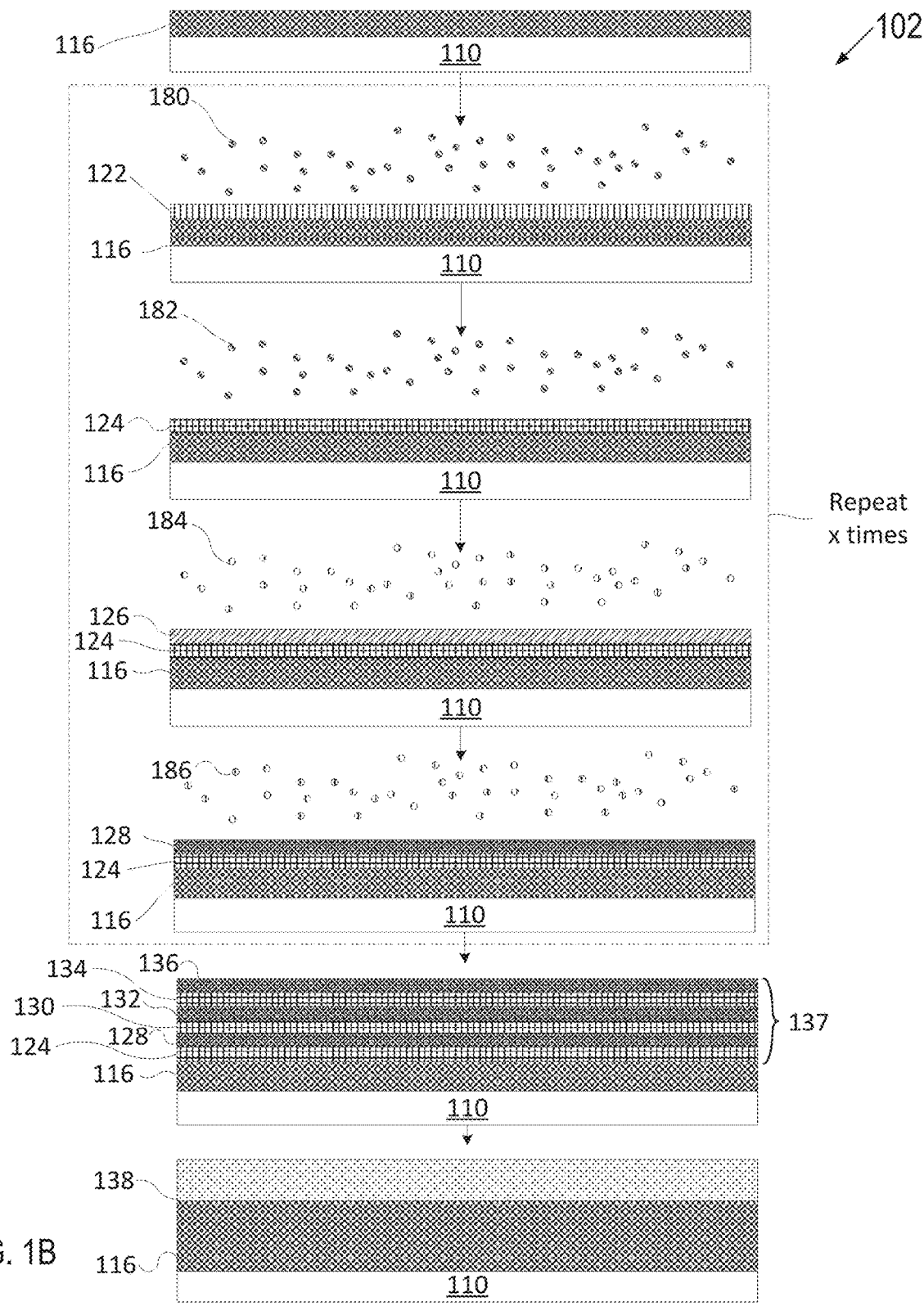
FIG. 1B depicts another embodiment of an atomic layer deposition process described herein.
Figure 1C:
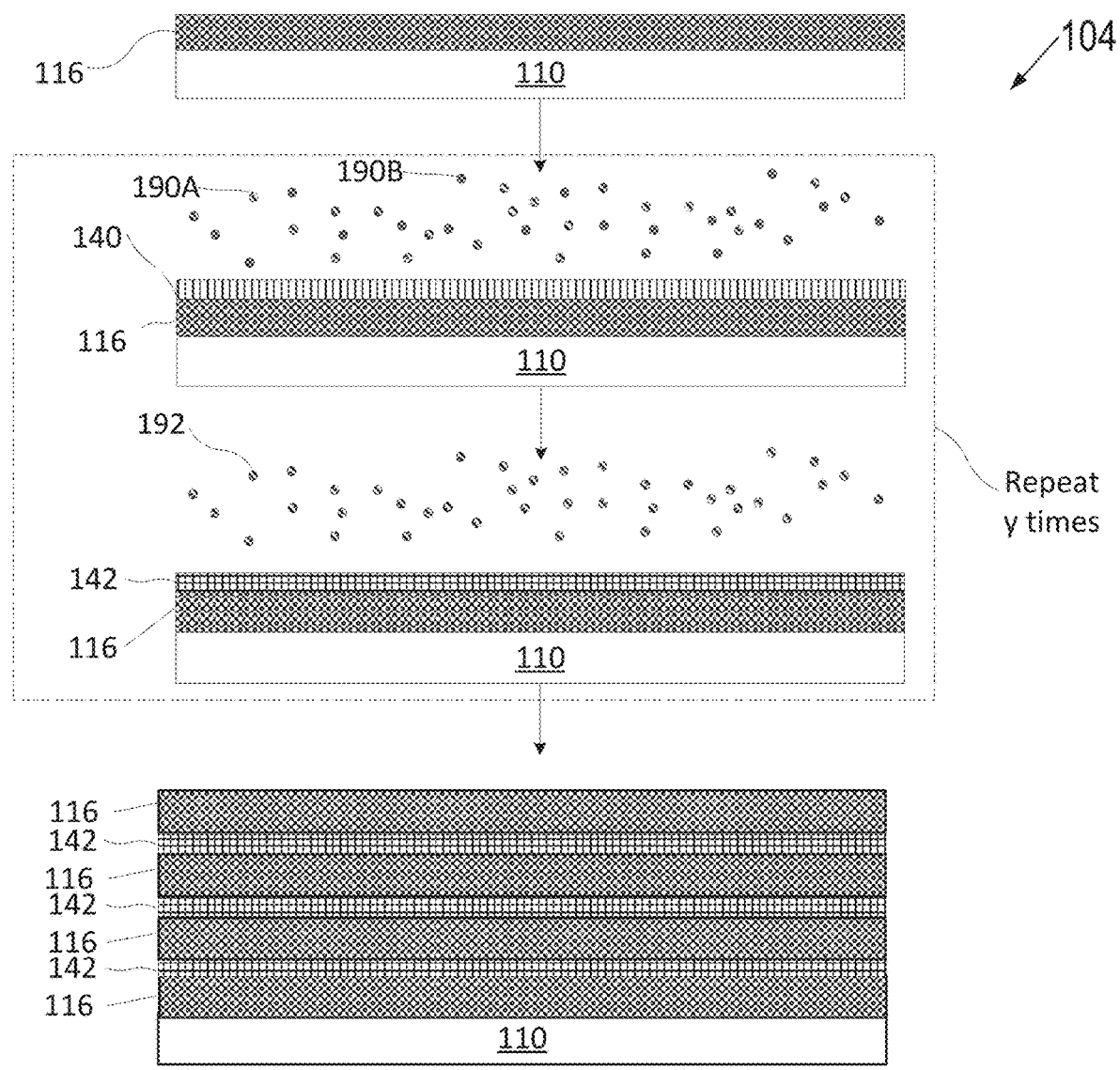
FIG. 1C depicts yet another embodiment of an atomic layer deposition process described herein.

FIG. 1A depicts one embodiment of a deposition process 100 in accordance with an ALD technique to grow or deposit a plasma resistant protective coating on an article. FIG. 1B depicts another embodiment of a deposition process 102 in accordance with an ALD technique as described herein. FIG. 1C depicts yet another embodiment of a deposition process 104 in accordance with an ALD deposition technique as described herein. Various types of ALD processes exist and the specific type may be selected based on several factors such as the surface to be coated, the coating material, chemical interaction between the surface and the coating material, etc. The general principle for the various ALD processes comprises growing a thin film layer by repeatedly exposing the surface to be coated to pulses of gaseous chemical precursors that chemically react with the surface one at a time in a self-limiting manner.

FIGS. 1A-1C illustrate an article 110 having a surface. Article 110 may represent various process chamber components (e.g., semiconductor process chamber components) including but not limited to an electrostatic chuck, a nozzle, a gas distribution plate, a showerhead, an electrostatic chuck component, a chamber wall, a liner, a liner kit, a gas line, a lid, a chamber lid, a nozzle, a single ring, a processing kit ring, a base, a shield, a plasma screen, a flow equalizer, a cooling base, a chamber viewport, a bellow, a faceplate, selectivity modulating device, and so on. The article 110 (and article 230 in FIG. 2) may be made from a metal (such as aluminum, stainless steel), a ceramic (such as $Y_2O_3$, $Al_2O_3$, $Y_3Al_5O_{12}$ (YAG), and so forth), a metal-ceramic composite, a polymer, a polymer ceramic composite, mylar, polyester, or other suitable materials, and may further comprise materials such as AlN, Si, SiC, $Al_2O_3$, $SiO_2$, and so on.

For ALD, either adsorption of a precursor onto a surface or a reaction of a reactant with the adsorbed precursor may be referred to as a "half-reaction." During a first half reaction, a precursor is pulsed onto the surface of the article 110 (or onto a layer formed on the article 110) for a period of time sufficient to allow the precursor to fully adsorb onto the surface. The adsorption is self-limiting as the precursor will adsorb onto a finite number of available sites on the surface, forming a uniform continuous adsorption layer on the surface. Any sites that have already adsorbed a precursor will become unavailable for further adsorption with the same precursor unless and/or until the adsorbed sites are subjected to a treatment that will form new available sites on the uniform continuous coating. Exemplary treatments may be plasma treatment, treatment by exposing the uniform continuous adsorption layer to radicals, or introduction of a different precursor able to react with the most recent uniform continuous layer adsorbed to the surface.

In some embodiments, two or more precursors are injected together and adsorbed onto the surface of an article. The excess precursors are pumped out until an oxygen-containing reactant is injected to react with the adsorbents to form a single metal oxide layer or a multi-metal oxide layer (e.g., of YAG, a phase of $Y_2O_3$—$ZrO_2$, and so on). This fresh layer is ready to adsorb the precursors in the next cycle.

In FIG. 1A, article 110 may be introduced to a first precursor 160 for a first duration until a surface of article 110 is fully adsorbed with the first precursor 160 to form an adsorption layer 114. Subsequently, article 110 may be introduced to a first reactant 165 to react with the adsorption layer 114 to grow a rare-earth oxide layer 116 (e.g., so that the rare-earth oxide layer 116 is fully grown or deposited, where the terms grown and deposited may be used interchangeably herein). The first precursor 160 may be a precursor for yttrium or another metal, for example. The first reactant 165 may be oxygen, water vapor, ozone, pure oxygen, oxygen radicals, or another oxygen source if the rare-earth layer 116 is an oxide. Accordingly, ALD may be used to form the rare-earth oxide layer 116.

In an example where the rare-earth oxide layer 116 is a yttria ($Y_2O_3$) rare-earth oxide layer, article 110 (e.g., an Al6061 substrate with or without an Alumina buffer layer) may be introduced to a first precursor 160 (e.g., tris(methylcyclopentadienyl) yttrium) for a first duration until all the reactive sites on the surface are consumed. The remaining first precursor 160 is flushed away and then a first reactant 165 of $H_2O$ is injected into the reactor to start the second half cycle. A rare-earth oxide layer 116 of $Y_2O_3$ is formed after $H_2O$ molecules react with the Y containing adsorption layer created by the first half reaction.

Rare-earth oxide layer 116 may be uniform, continuous and conformal. The rare-earth oxide layer 116 may be porosity free (e.g., have a porosity of 0) or have an approximately 0 porosity in embodiments (e.g., a porosity of 0% to 0.01%). Layer 116 may have a thickness of less than one atomic layer to a few atoms in some embodiments after a single ALD deposition cycle. Some metalorganic precursor molecules are large.

Multiple full ALD deposition cycles may be implemented to deposit a thicker rare-earth oxide layer 116, with each full cycle (e.g., including introducing precursor 160, flushing, introducing reactant 165, and again flushing) adding to the thickness by an additional fraction of an atom to a few atoms. As shown, up to n full cycles may be performed to grow the rare-earth oxide layer 116, where n is an integer value greater than 1. In embodiments, rare-earth oxide layer 116 may have a thickness of about 500 angstroms to about 10000 angstroms, about 500 angstroms to about 5000 angstroms, about 1000 angstroms to about 5000 angstroms, or about 1500 angstroms to about 2500 angstroms.

Since ALD is used for the deposition, the internal surfaces of high aspect ratio features such as gas delivery holes in a showerhead or a gas delivery line may be coated, and thus an entirety of a component may be protected from exposure to a corrosive environment.

Layer 116 may be $Y_2O_3$, such as crystalline $Y_2O_3$ having a single cubic phase, in embodiments. In one embodiment, the yttrium oxide cubic phase may display an X-Ray Diffraction profile that corresponds to a Powder Dispersion File No. 04-005-4378.

It should be understood that in some embodiments, layer 116 may comprise more than one rare-earth metal. Depositing a multi-elemental rare earth oxide layer via ALD may occur through sequential deposition as described regarding the metal oxide layer in FIG. 1B or co-deposition as described in more detail in FIG. 10.

Subsequently, article 110 having layer 116 may be introduced to an additional precursor(s) 170 for a second duration until a surface of rare-earth oxide layer 118 is fully adsorbed with the additional precursor(s) 170 to form an adsorption layer 118. Subsequently, article 110 may be introduced to a reactant 175 to react with adsorption layer 118 to grow an amorphous or a crystalline single phase or multiphase metal oxide layer 120, also referred to as the interruption layer 120 for simplicity (e.g., so that the interruption layer 120 is fully grown or deposited). Accordingly, the interruption layer 120 is fully grown or deposited over rare-earth oxide layer 116 using ALD. In an example, precursor 170 may be a zirconium containing precursor (e.g., tris(dimethylamino)cyclopentadienyl zirconium) used in the first half cycle, and reactant 175 may be ozone used in the second half cycle.

The interruption layer 120 forms the amorphous or crystalline single phase or multiphase metal oxide layer, which may be uniform, continuous and conformal. The second layer 120 may have a very low porosity of less than 1% in embodiments, and less than 0.1% in further embodiments, and about 0% in embodiments or porosity-free in still further embodiments. Second layer 120 may have a thickness of less than an atom to a few atoms (e.g., 2-3 atoms) after a single full ALD deposition cycle. Multiple ALD deposition stages may be implemented to deposit a thicker interruption layer 120, with each stage adding to the thickness by an additional fraction of an atom to a few atoms. As shown, the full deposition cycle may be repeated m times to cause the interruption layer 120 to have a target thickness, where m is an integer value greater than 1. In embodiments, interruption layer 120 may have a thickness of about 1 angstroms to about 500 angstroms, about 2 angstroms to about 200 angstroms, or about 3 angstroms to about 50 angstroms.

A ratio of the rare-earth oxide layer thickness to the interruption layer thickness may be about 5000:1 to about 1:1 or about 2500:1. In some embodiments, the ratio of rare-earth oxide thickness to the interruption layer thickness may be about 500:1 to about 1:1. In yet other embodiments, the ratio of rare-earth oxide thickness to the interruption layer thickness may be about 2500:8, about 2500:12, or about 2500:16. The ratio of rare-earth oxide layer to the interruption layer may be such that the protective coating provides improved corrosion and erosion resistance as well as improved resistance to cracking and/or delamination caused by chamber processing. The thickness ratio may be selected in accordance with specific chamber applications.

Figure 4C:
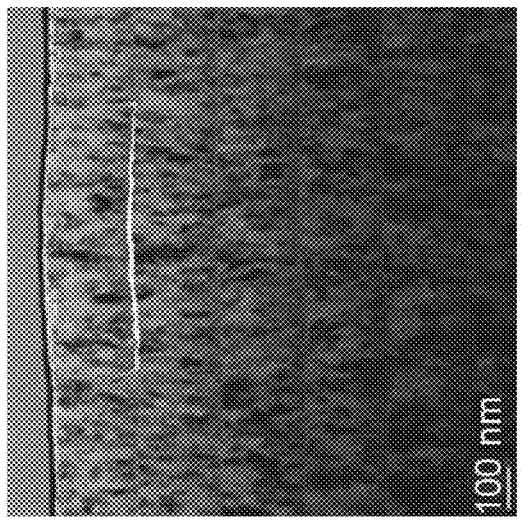
FIG. 4C depicts a TEM image at a 100 nm scale of a yttrium oxide coating with carbon-rich yttria interruption layers.
Figure 4B:
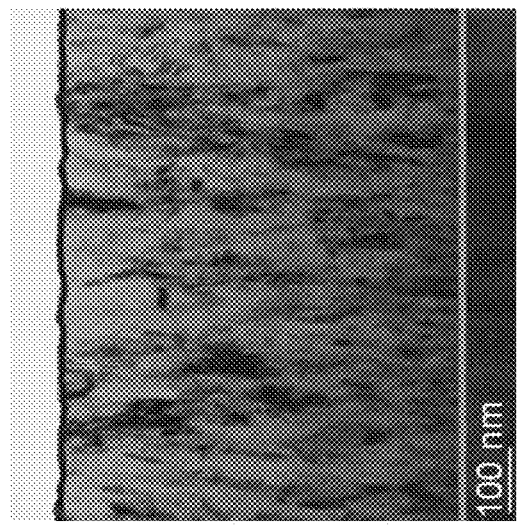
FIGS. 4A and 4B depict Transmission Electron Microscopy (TEM) image of various scales (0.2 µm scale and 100 nm scale, respectively) of a 600 nm yttrium oxide coating without any interruption layers.
Figure 4A:
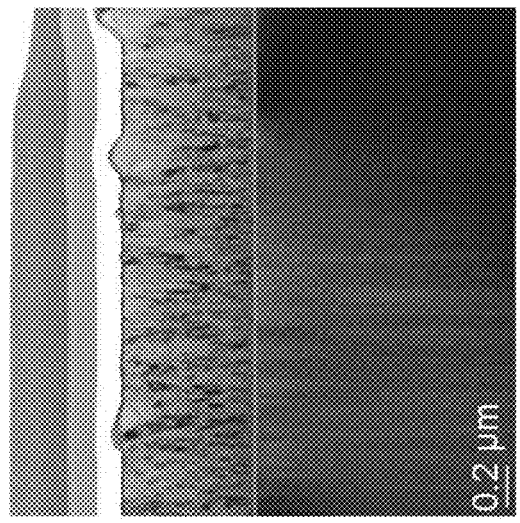

As shown in FIGS. 4A and 4B, yttrium oxide layer deposited without an interruption layer result in uncontrollable and abnormally large grain growth. For instance, abnormally large yttrium oxide grains shown in FIGS. 4A and 4B may have a height of about 100 nm and a width of about 200 nm. These abnormally large grains lead to higher surface roughness and make the coating more prone to defect. This phenomenon is apparent with a yttrium oxide coating of 600 nm thickness and will become even more pronounced with a yttrium oxide coating of greater thickness (see for examples FIG. 14A for grains in a 1 μm thick yttria coating without interruption layers). Furthermore, the lack of interruption layers provides chemicals a direct pathway to diffuse through cracks and spaces between large grains and reach the interface between the coating and the article, potentially harming the coated article.

FIG. 4C illustrates interruption layers between layers of yttrium oxide (i.e., after every layer of yttrium oxide with a thickness of 250 nm a carbon-rich yttrium oxide interruption layer was deposited). Indeed, the yttrium oxide grain growth is more controlled and so are the surface boundaries and surface roughness. None of the grains in FIG. 4C exceed 100 nm in length of 200 nm in width. Furthermore, there is no direct pathway from the corrosive chamber environment all the way through the coating to the interface between the coating and the article. However, the high carbon content in the interruption layer, makes the layer relatively weak. As a result, during processing, upon the exertion of the compressive stress on the protective coating, the top yttrium oxide layer buckles up and begins to laminate, as depicted in FIG. 4C. Such delamination generates particles and affects the lifetime of the coated article, the lifetime of the coating, and wafer processing. Compressive stress is exerted after fluorination, when the crystalline lattice of the protective coating begins to expand.

If the interruption layer was stronger than the carbon interruption layers, the yttrium oxide layers and interruption layers would remain connected and would not buckle up. A stronger interruption layer is believed to be one that has a similar composition to the yttrium oxide layer but a dissimilar atomic crystalline phase that would inhibit uncontrollable grain growth. Thus, the decision as to the type of metal oxide layer selected for the interruption layer, the type of rare-earth oxide layer selected, and their corresponding thicknesses, should account for the need to control grain growth of the rare earth oxide, while also ensuring a sufficiently strong bond between the rare earth oxide layer and the interruption layer so as to prevent delamination and particle generation.

Figure 3:
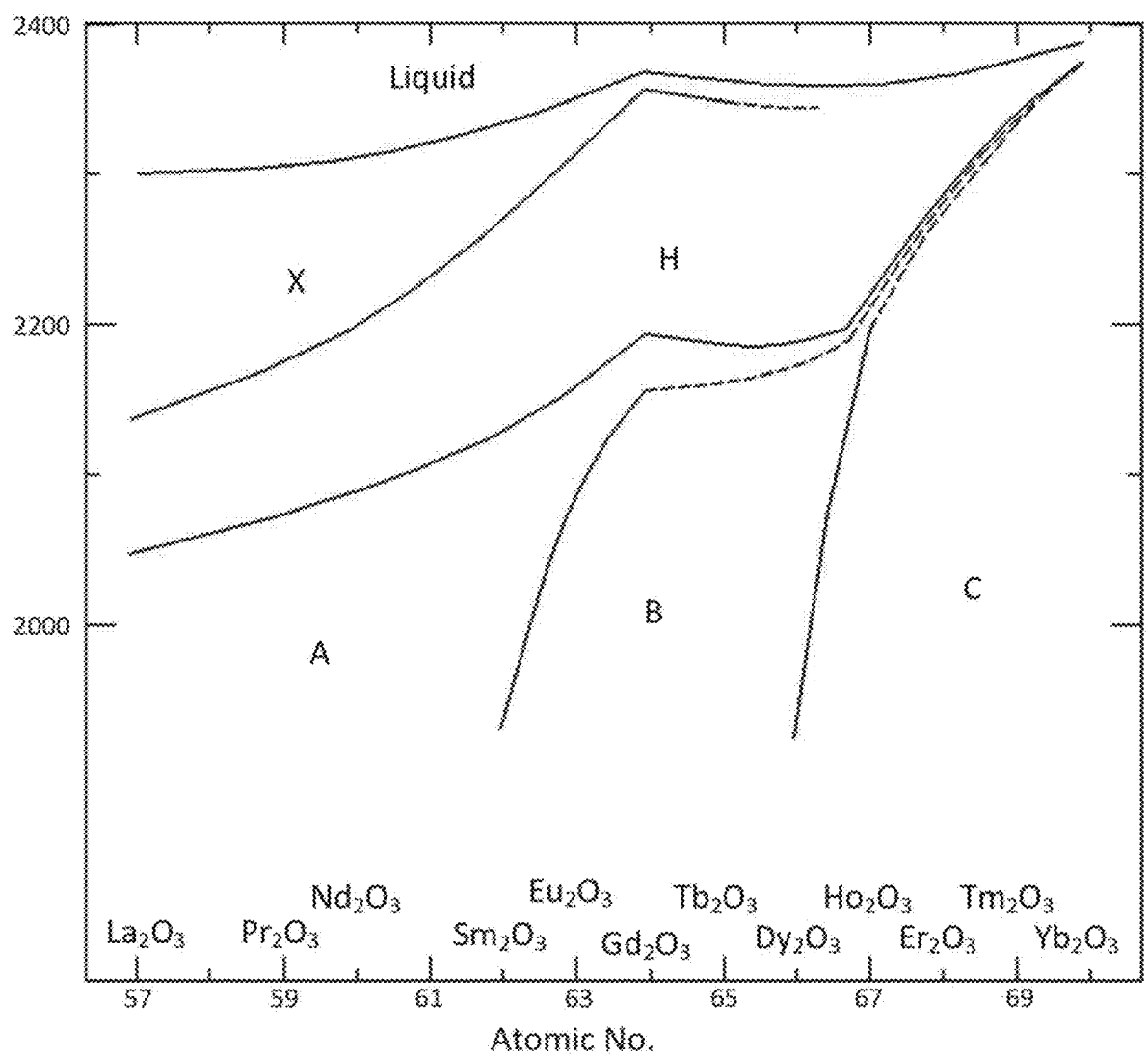
FIG. 3 depicts different crystal phases of various rare-earth oxides at different temperatures.

Interruption layer 120 may be any of the aforementioned rare-earth metal-containing oxide layers as well as zirconium oxide, aluminum oxide and mixtures thereof. For example, the interruption layer 120 may be $ZrO_2$, alone or in combination with one or more other rare earth metal oxides. In some embodiments, interruption layer 120 is a crystalline single phase or multiphase material having one or more atomic crystalline phases formed from a single metal oxide or a mixture of at least two metal oxide precursors that have been sequentially deposited or co-deposited by ALD. For example, interruption layer 120 may be one of $La_2O_3$, $Pr_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $ZrO_2$, and combinations thereof (as depicted in FIG. 3). In certain embodiments, the interruption layer may be amorphous. In embodiments when the interruption layer is crystalline, the one or more crystalline atomic phases of the interruption layer may be different from the one or more crystalline atomic phase of the rare-earth oxide layer. In embodiments when at least one of the crystalline atomic phases of the interruption layer is the same as the at least one crystalline atomic phase of the rare-earth oxide layer, the lattice structure of the similar crystalline atomic phases may differ. For instance, the atomic crystalline phase(s) may be selected from the group consisting of hexagonal, tetragonal, cubic, monoclinic, and combinations thereof.

In some embodiments, first layer 116 and second layer 120 may, independently, include a material such as $Y_2O_3$ and $Y_2O_3$ based ceramics, $Y_3Al_5O_{12}$ (YAG), $Al_2O_3$ (alumina), $Y_4Al_2O_9$ (YAM), $ErAlO_3$, $GdAlO_3$, $NdAlO_3$, $YAlO_3$, $TiO_2$ (titania), $ZrO_2$ (zirconia), $Y_2O_3$ stabilized $ZrO_2$ (YSZ), $Er_2O_3$ and $Er_2O_3$ based ceramics, $Gd_2O_3$ and $Gd_2O_3$ based ceramics, $Er_3Al_5O_{12}$ (EAG), $Gd_3Al_5O_{12}$ (GAG), $Nd_2O_3$ and $Nd_2O_3$ based ceramics, a ceramic compound comprising $Y_2O_3$ and $YF_3$ (e.g., Y—O—F), a ceramic compound comprising $Y_4Al_2O_9$ and a solid-solution of $Y_2O_3$—$ZrO_2$, a ceramic compound comprising $Y_2O_3$, $Er_2O_3$, $ZrO_2$, $Gd_2O_3$ and $SiO_2$, or a combination of any of the above.

The material of first layer 116 and second layer 120 may also be based on a solid solution formed by any of the aforementioned ceramics. The material may also be a multiphase material that includes a solid solution of one or more of the aforementioned materials and one or more additional phase.

With reference to the solid-solution of $Y_2O_3$—$ZrO_2$, the material may include $Y_2O_3$ at a concentration of 10-90 molar ratio (mol %) and $ZrO_2$ at a concentration of 10-90 mol %. In some examples, the solid-solution of $Y_2O_3$—$ZrO_2$ may include 10-20 mol % $Y_2O_3$ and 80-90 mol % $ZrO_2$, may include 20-30 mol % $Y_2O_3$ and 70-80 mol % $ZrO_2$, may include 30-40 mol % $Y_2O_3$ and 60-70 mol % $ZrO_2$, may include 40-50 mol % $Y_2O_3$ and 50-60 mol % $ZrO_2$, may include 60-70 mol % $Y_2O_3$ and 30-40 mol % $ZrO_2$, may include 70-80 mol % $Y_2O_3$ and 20-30 mol % $ZrO_2$, may include 80-90 mol % $Y_2O_3$ and 10-20 mol % $ZrO_2$, and so on.

With reference to the ceramic compound comprising $Y_4Al_2O_9$ and a solid-solution of $Y_2O_3$—$ZrO_2$, in one embodiment the ceramic compound includes 62.93 molar ratio (mol %) $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the ceramic compound can include $Y_2O_3$ in a range of 40-100 mol %, $ZrO_2$ in a range of 0.1-60 mol % and $Al_2O_3$ in a range of 0.1-10 mol %. In another embodiment, the ceramic compound can include $Y_2O_3$ in a range of 40-60 mol %, $ZrO_2$ in a range of 35-50 mol % and $Al_2O_3$ in a range of 10-20 mol %. In another embodiment, the ceramic compound can include $Y_2O_3$ in a range of 40-50 mol %, $ZrO_2$ in a range of 20-40 mol % and $Al_2O_3$ in a range of 20-40 mol %. In another embodiment, the ceramic compound can include $Y_2O_3$ in a range of 80-90 mol %, $ZrO_2$ in a range of 0.1-20 mol % and $Al_2O_3$ in a range of 10-20 mol %. In another embodiment, the ceramic compound can include $Y_2O_3$ in a range of 60-80 mol %, $ZrO_2$ in a range of 0.1-10 mol % and $Al_2O_3$ in a range of 20-40 mol %. In another embodiment, the ceramic compound can include $Y_2O_3$ in a range of 40-60 mol %, $ZrO_2$ in a range of 0.1-20 mol % and $Al_2O_3$ in a range of 30-40 mol %. In other embodiments, other distributions may also be used for the ceramic compound.

In one embodiment, the material includes or consists of a ceramic compound that includes a combination of $Y_2O_3$, $ZrO_2$, $Er_2O_3$, $Gd_2O_3$ and $SiO_2$. In one embodiment, the ceramic compound can include $Y_2O_3$ in a range of 40-45 mol %, $ZrO_2$ in a range of 0-10 mol %, $Er_2O_3$ in a range of 35-40 mol %, $Gd_2O_3$ in a range of 5-10 mol % and $SiO_2$ in a range of 5-15 mol %. In a first example, the alternative ceramic compound includes 40 mol % $Y_2O_3$, 5 mol % $ZrO_2$, 35 mol % $Er_2O_3$, 5 mol % $Gd_2O_3$ and 15 mol % $SiO_2$. In a second example, the alternative ceramic compound includes 45 mol % $Y_2O_3$, 5 mol % $ZrO_2$, 35 mol % $Er_2O_3$, 10 mol % $Gd_2O_3$ and 5 mol % $SiO_2$. In a third example, the alternative ceramic compound includes 40 mol % $Y_2O_3$, 5 mol % $ZrO_2$, 40 mol % $Er_2O_3$, 7 mol % $Gd_2O_3$ and 8 mol % $SiO_2$.

Any of the aforementioned materials may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. The materials allow for longer working lifetimes due to the plasma resistance of the ceramic materials and decreased on-wafer or substrate contamination.

With reference to FIG. 1B, in some embodiments, the plasma resistant protective coating contains more than two layers. Specifically, the plasma resistant protective coating may include a stack of alternating layers of the rare-earth oxide layer and interruption layer.

Referring to FIG. 1B, an article 110 having a rare-earth oxide layer 116 may be inserted into a deposition chamber. The rare-earth oxide layer 116 may have been formed as set forth with reference to FIG. 1A. FIG. 1B illustrate an ALD process with sequential deposition to form a multi-elemental interruption layer. Article 110 having rare-earth oxide layer 116 may be introduced to one or more precursors 180 for a duration until a surface of rare-earth oxide layer 116 is fully adsorbed with the one or more additional precursors 180 to form an adsorption layer 122. Subsequently, article 110 may be introduced to a reactant 182 to react with adsorption layer 122 to grow a solid metal oxide layer 124. Accordingly, the metal oxide layer 124 is fully grown or deposited over rare-earth oxide layer 116 using ALD. In an example, precursor 180 may be a zirconium containing precursor used in the first half cycle, and reactant 182 may be $H_2O$ used in the second half cycle. The metal oxide layer one of $La_2O_3$, $Pr_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $ZrO_2$, $Al_2O_3$ or another oxide and combinations thereof.

Article 110 having rare-earth oxide layer 116 and metal oxide layer 124 may be introduced to one or more precursors 184 for a duration until a surface of metal oxide layer 124 is fully adsorbed with the one or more precursors 184 to form an adsorption layer 126. Precursor 184 may be different from precursor 180. Subsequently, article 110 may be introduced to a reactant 186 to react with adsorption layer 126 to grow an additional solid metal oxide layer 128. Accordingly, the additional metal oxide layer 128 is fully grown or deposited over the metal oxide layer 124 using ALD. In an example, precursor 184 may be a yttrium containing precursor used in the first half cycle, and reactant 186 may be $H_2O$ used in the second half cycle. The metal oxide layer 124 may be one of $La_2O_3$, $Pr_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $ZrO_2$, or another oxide and combinations thereof.

In some embodiments, the metal oxide layer may be crystalline and may be selected from the group consisting of: a composition ranging from a pure crystalline single phase zirconia in at least one of a tetragonal phase or a monoclinic phase to a crystalline multiphase or a crystalline single phase yttrium zirconium oxide with an atomic percentage of zirconium of about 5%, based on the total atoms in the composition; a mixture of about 65 wt % of zirconium oxide in a tetragonal phase and about 35 wt % of zirconium oxide in a monoclinic phase; about 100 wt % multi-elemental oxide of zirconium yttrium oxide in a tetragonal phase; a mixture of about 70 wt % of a multi-elemental oxide of zirconium yttrium oxide in a first cubic phase and about 30 wt % of yttrium oxide in a second cubic phase, wherein the first cubic phase and the second cubic phase have a lattice structure that is different from the lattice structure of the crystalline yttrium oxide layer; and a mixture of about 30 wt % of a multi-elemental oxide of zirconium yttrium oxide in the first cubic phase and about 70 wt % of yttrium oxide in the second cubic phase.

As shown, the deposition of the metal oxide 124 and the second metal oxide 128 may be repeated x times to form a stack 137 of alternating layers, where x is an integer value greater than 1. x may represent a finite number of layers selected based on the targeted thickness and properties. The stack 137 of alternating layers may be considered as an interruption layer containing multiple alternating sub-layers. Accordingly, precursor 180, reactant 182, precursor 184 and reactant 186 may be repeatedly introduced sequentially to grow or deposit additional alternating layers 130, 132, 134, 136, and so on. Each of the layers 124, 128, 130, 132, 134, 136, and so on may be very thin layers having a thickness of less than a single atomic layer to a few atomic layers.

The alternating layers 124-136 described above have a 1:1 ratio, where there is a single layer of a first metal oxide for each single layer of a second metal oxide. However, in other embodiments there may be other ratios such as 2:1, 3:1, 4:1, and so on between the different types of metal oxide layers. For example, three $ZrO_2$ layers may be deposited for every $Y_2O_3$ layer in an embodiment. Additionally, the stack 137 of alternating layers 124-136 have been described as an alternating series of two types of metal oxide layers. However, in other embodiments more than two types of metal oxide layers may be deposited in an alternating stack 137. For example, the stack 137 may include three different alternating layers (e.g., a first layer of $Y_2O_3$, a first layer of $Al_2O_3$, a first layer of $ZrO_2$, a second layer of $Y_2O_3$, a second layer of $Al_2O_3$, a second layer of $ZrO_2$, and so on).

The process of forming multi-layer stack 137 of metal oxide interruption layer is also referred to herein as sequential deposition. Such sequential deposition may also be used for the rare-earth oxide layer when the rare-earth oxide layer contains more than one rare-earth.

After the stack 137 of alternating layers has been formed, an anneal process may be performed to cause the alternating layers of different materials to diffuse into one another and form a complex oxide having a single crystalline phase or multiple crystalline phases. After the annealing process, the stack of alternating layers 137 may therefore become a single interruption layer 138. For example, if the layers in the stack are $Y_2O_3$, $Al_2O_3$, and $ZrO_2$, then the resulting rare-earth metal-containing oxide layer 138 may a ceramic compound comprising $Y_4Al_2O_9$ and a solid-solution of $Y_2O_3$—$ZrO_2$.

In some embodiments, the deposition of rare-earth oxide layer 116 and interruption layer stack 137 (or 138 if annealed) may be repeated z number of times to form a final plasma resistant protective coating. The final plasma resistant protective coating may comprise alternating layers of rare-earth oxide layers and intermittent metal oxide interruption layers.

Figure 10:
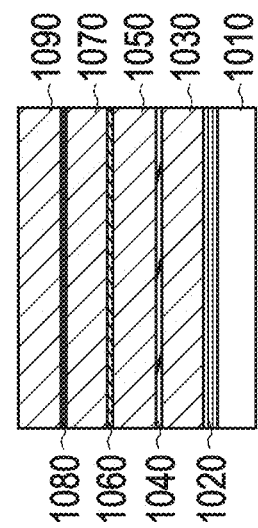
FIG. 10 depicts an exemplary plasma resistant protective coating of yttrium oxide and gadolinium oxide in accordance with example 5.

Referring to FIG. 1C, an article 110 having a rare-earth oxide layer 116 may be inserted into a deposition chamber. The rare-earth oxide layer 116 may have been formed as set forth with reference to FIG. 1A. Article 110 having rare-earth oxide layer 116 may be introduced, in some embodiments, to a plurality of precursors 190A, 190B that may be co-injected or sequentially injected for a duration until a surface of rare-earth oxide layer 116 is fully adsorbed with the plurality of precursors 190A, 190B to form a multi-elemental adsorption layer 140. Subsequently, article 110 may be introduced to a reactant 192 to react with adsorption layer 140 to grow a solid multi-elemental metal oxide layer 142. Accordingly, the multi-elemental metal oxide layer 142 is fully grown or deposited over rare-earth oxide layer 116 using ALD. The process of introducing the precursors 190A, 190B and then the reactant 192 may be repeated y times to cause the multi-elemental metal oxide interruption layer 142 to have a target thickness and ultimately form an amorphous or a crystalline single phase or multiphase interruption layer. In FIG. 10, y is an integer greater than 1.

The process of forming interruption layer 142 in FIG. 10 is also referred to herein as co-deposition deposition. Such co-deposition may also be used for the rare-earth oxide layer when the rare-earth oxide layer contains more than one rare-earth.

The deposition of the rare-earth oxide layer 116 and interruption layer 142 may be repeated z times to form a stack of alternating layers which form the final plasma resistant protective coating. z may be an integer value greater than 1. z may represent a finite number of layers selected based on the targeted thickness and properties of the final plasma resistant protective coating.

The final structure shown in FIGS. 1A-1B are a cross sectional side view of an article 110 coated with a bilayer plasma resistant protective coating that comprises a crystalline rare-earth oxide layer 116 and an amorphous or a crystalline interruption layer 120 (per FIG. 1A), 137 or 138 (per FIG. 1B). The final structure shown in FIG. 1C is a cross sectional side view of an article 110 coated with a multilayer plasma resistant protective coating that comprises a rare-earth oxide layer 116 and amorphous or crystalline interruption layers 142. The crystalline rare-earth oxide layer 116 may be yttrium oxide in a cubic phase with a first lattice structure in some embodiments. The crystalline or amorphous interruption layer 120, 137/138, or 142 may comprise a rare-earth metal oxide, zirconium oxide, aluminum oxide or a mixture thereof. In embodiments where the interruption layer is crystalline, the interruption may have one or more crystalline phases that are different from the crystalline phase of the rare-earth oxide layer 116.

Interruption layers 120, 137/138, or 142 may be, independently, selected from the list of materials enumerated above.

The crystalline rare-earth oxide layer 116 may have a thickness of about 500 angstroms to about 5000 angstroms. In embodiments, the rare-earth oxide layer may have a thickness of about 1000-5000 angstroms. In further embodiments, the rare-earth oxide layer 116 may have a thickness of about 1500-2500 angstroms.

The interruption layers 120, 137/138, or 142 may have a thickness of about 1 angstrom to about 500 angstroms and may be formed by performing about 1-500 cycles of an ALD process, where each cycle forms a nanolayer (or slightly less or more than a nanolayer) of the interruption layer. In embodiments, the interruption layer 120, 137/138, or 142 may have a thickness of about 2 angstroms to about 200 angstroms. In further embodiments, the interruption layer 120, 137/138, or 142 may have a thickness of about 3 angstroms to about 50 angstroms. In one embodiment, each layer of the interruption layer is formed using about 1-10 ALD cycles.

In further embodiments, the plasma resistant protective coating may have a thickness of about 500 nm to about 5 μm. In further embodiments, the plasma resistant protective coating may have a thickness of about 1 μm to about 5 μm, or about 1 μm to about 2 μm. The interruption layers 120, 137, 138, or 142 between the rare-earth metal oxide layers 116 may inhibit uncontrollable and abnormally large crystal growth in the rare-earth oxide layers.

In the embodiments described with reference to FIGS. 1A-1C, the surface reactions (e.g., half-reactions) may be done sequentially, i.e. where the various precursors and reactants are not in contact. Prior to introduction of a new precursor or reactant, the chamber in which the ALD process takes place may be purged with an inert carrier gas (such as nitrogen or air) to remove any unreacted precursor and/or surface-precursor reaction byproducts. The precursors may be different for each layer. In some embodiments, the surface reactions may be done through co-deposition, i.e., where at least two precursors are used, in some embodiments at least three precursors are used and in yet further embodiments at least four precursors are used. Prior to the introduction of one or more reactants, the plurality of precursors may be co-injected into the ALD chamber. The ALD chamber may be purged with an inert carrier gas (such as nitrogen or air) to remove any unreacted precursors and/or surface-precursor reaction byproducts.

ALD processes may be conducted at various temperatures depending on the type of process. The optimal temperature range for a particular ALD process is referred to as the "ALD temperature window." Temperatures below the ALD temperature window may result in poor growth rates and non-ALD type deposition. Temperatures above the ALD temperature window may result in reactions taken place via a chemical vapor deposition (CVD) mechanism. The ALD temperature window may range from about 100° C. to about 400° C. In some embodiments, the ALD temperature window is between about 120-300° C.

The ALD process allows for a conformal plasma resistant protective coating having uniform thickness on articles and surfaces having complex geometric shapes, holes with high aspect ratios, and three-dimensional structures. Sufficient exposure time of each precursor to the surface enables the precursor to disperse and fully react with the surface in its entirety, including all of its three-dimensional complex features. The exposure time utilized to obtain conformal ALD in high aspect ratio structures is proportionate to the square of the aspect ratio and can be predicted using modeling techniques. Additionally, the ALD technique is advantageous over other commonly used coating techniques because it allows in-situ on demand material synthesis of a particular composition or formulation without the need for a lengthy and difficult fabrication of source materials (such as powder feedstock and sintered targets). In some embodiments ALD is used to coat articles aspect ratios of about 10:1 to about 300:1.

With the ALD techniques described herein, multi-component films can be grown, deposited or co-deposited, for example, by proper mixtures of the precursors used to grow the interruption layer as described above and in more detail in the examples below.

Figure 2:
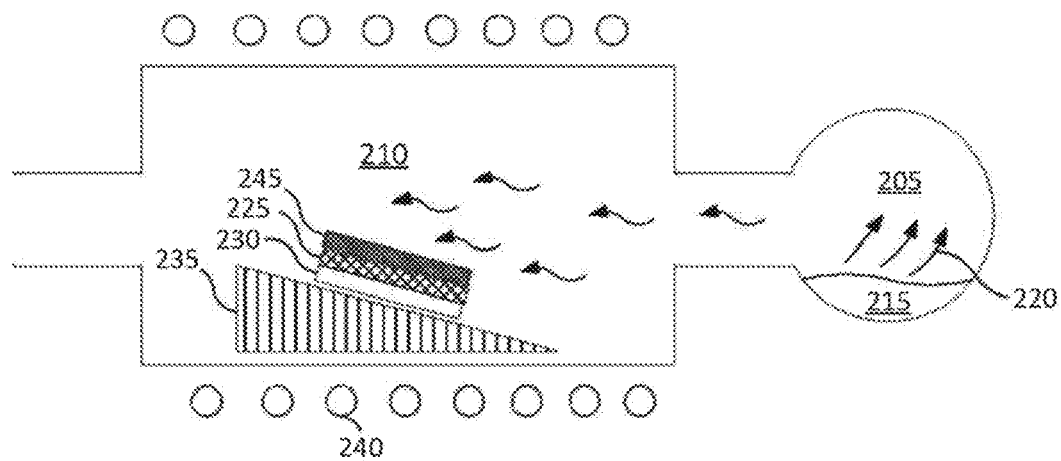
FIG. 2 depicts a chemical vapor deposition technique that may be used when depositing plasma resistant protective coating in accordance with embodiments.

In some embodiments, the plasma resistant protective coating may be deposited on a surface of an article via CVD. An exemplary CVD system is illustrated in FIG. 2. The system comprises a chemical vapor precursor supply system 205 and a CVD reactor 210. The role of the vapor precursor supply system 205 is to generate vapor precursors 220 from a starting material 215, which could be in a solid, liquid, or gas form. The vapors may subsequently be transported into CVD reactor 210 and get deposited as a plasma resistant protective coat 225 and/or 245 on the surface of article 230, in accordance with an embodiment, which may be positioned on article holder 235.

The plasma resistant protective coating depicted in FIG. 2 comprises a bilayer of a crystalline single phase or multiphase rare-earth oxide layer 225 and an amorphous or a crystalline single phase or multiphase metal oxide interruption layer 245. It is understood by one of ordinary skill in the art that although only a bilayer is exemplified with respect to the CVD process, a multilayer plasma resistant protective coating is also contemplated herein with respect to a CVD process. A multilayer plasma resistant protective coating comprising a stack of alternating layers of a (poly) crystalline single phase or multiphase rare-earth oxide and an amorphous or (poly)crystalline single phase or multiphase metal oxide interruption layers deposited by CVD are contemplated in certain embodiments herein.

CVD reactor 210 heats article 230 to a deposition temperature using heater 240. In some embodiments, the heater may heat the CVD reactor's wall (also known as "hot-wall reactor") and the reactor's wall may transfer heat to the article. In other embodiments, the article alone may be heated while maintaining the CVD reactor's wall cold (also known as "cold-wall reactor"). It is to be understood that the CVD system configuration should not be construed as limiting. A variety of equipment could be utilized for a CVD system and the equipment is chosen to obtain optimum processing conditions that may give a coating with uniform thickness, surface morphology, structure, and composition.

The various CVD techniques include the following phases: (1) generate active gaseous reactant species (also known as "precursors") from the starting material; (2) transport the precursors into the reaction chamber (also referred to as "reactor"); (3) absorb the precursors onto the heated article; (4) participate in a chemical reaction between the precursor and the article at the gas-solid interface to form a deposit and a gaseous by-product; and (5) remove the gaseous by-product and unreacted gaseous precursors from the reaction chamber.

Suitable CVD precursors may be stable at room temperature, may have low vaporization temperature, can generate vapor that is stable at low temperature, have suitable deposition rate (low deposition rate for thin film coatings and high deposition rate for thick film coatings), relatively low toxicity, be cost effective, and relatively pure. For some CVD reactions, such as thermal decomposition reaction (also known as "pyrolysis") or a disproportionation reaction, a chemical precursor alone may suffice to complete the deposition.

CVD has many advantages including its capability to deposit highly dense and pure coatings and its ability to produce uniform films with good reproducibility and adhesion at reasonably high deposition rates. Layers deposited using CVD in embodiments may have a porosity of below 1%, and a porosity of below 0.1% (e.g., around 0%). Therefore, it can be used to uniformly coat complex shaped components and deposit conformal films with good conformal coverage (e.g., with substantially uniform thickness). CVD may also be utilized to deposit a film made of a plurality of components, for example, by feeding a plurality of chemical precursors at a predetermined ratio into a mixing chamber and then supplying the mixture to the CVD reactor system.

The CVD and ALD processes described herein may be used to form a plasma resistant protective coat that is resistant to erosion and/or corrosion in embodiments. Plasma resistant protective coat deposited by ALD or CVD may comprise a stack of alternating layers of crystalline rare-earth oxide layers and amorphous or crystalline interruption layers. In one embodiment, the plasma resistant protective coating may be a bilayer of a crystalline rare-earth oxide layer and an amorphous or crystalline interruption layer. When the plasma resistant protective coating comprises a stack of alternating layers, the first layer may be a rare-earth oxide layer. The amorphous or crystalline interruption layers may inhibit crystal/grain growth in the crystalline rare-earth oxide layers such that the grain size in the rare-earth oxide layer does not exceed the thickness of the rare-earth oxide layer and in some embodiments, so that the grain size does not exceed 100 nm or 200 nm.

The rare-earth oxide layers may have one or more atomic crystalline phases. The interruption layers may have one or more atomic crystalline phases that is/are different from the atomic crystalline phase(s) of the rare-earth oxide layer so as to inhibit crystal growth of the rare-earth oxide crystals. For instance, in one embodiment, the rare-earth oxide layers may be yttrium oxide layers in the cubic phase. In one embodiment, the interruption layers may be zirconium oxide layers in the tetragonal and monoclinic phases.

When the rare-earth oxide layer or the interruption layer contains more than one metal oxide, the materials forming each layer may be deposited sequentially or co-deposited (as described in detail for the ALD process through FIGS. 1A-1C). In some embodiments, layers containing more than one metal oxide may be subject to post coating heat treatment. In some embodiments, each layer in the plasma resistant protective coating or the final plasma resistant protective coat may be subject to post coating processing to form one or more features therein.

Exemplary yttrium-containing precursors that may be utilized with the CVD and ALD coating deposition techniques include, but are not limited to, tris(N,N-bis(trimethylsilyl)amide)yttrium (III), yttrium (III)butoxide, tris(cyclopentadienypyttrium(III), and Y(thd)3 (thd=2,2,6,6-tetramethyl-3,5-heptanedionato).

Exemplary erbium-containing precursors that may be utilized with the ALD and CVD coating deposition techniques include, but are not limited to, tris-methylcyclopentadienyl erbium (III) (Er(MeCp)$_3$), erbium boranamide (Er(BA)$_3$), Er(TMHD)$_3$, erbium(III) tris(2,2,6,6-tetramethyl-3,5-heptanedionate), and tris(butylcyclopentadienyl)erbium (III).

Exemplary aluminum-containing precursors that may be utilized with the ALD and CVD coating deposition techniques include, but are not limited to, diethylaluminum ethoxide, tris(ethylmethylamido)aluminum, aluminum sec-butoxide, aluminum tribromide, aluminum trichloride, triethylaluminum, triisobutylaluminum, trimethylaluminum, and tris(diethylamido)aluminum.

Exemplary zirconium-containing precursors that may be utilized with the ALD and CVD coating deposition techniques include, but are not limited to, zirconium (IV) bromide, zirconium (IV) chloride, zirconium (IV) tert-butoxide, tetrakis(diethylamido)zirconium (IV), tetrakis(dimethyl amido)zirconium (IV), and tetrakis(ethylmethylamido) zirconium (IV).

Exemplary oxygen-containing reactants that may be utilized with the various coating deposition techniques identified herein and their equivalent include, but are not limited to, ozone, water vapor, oxygen, and oxygen radicals.

Figure 11:
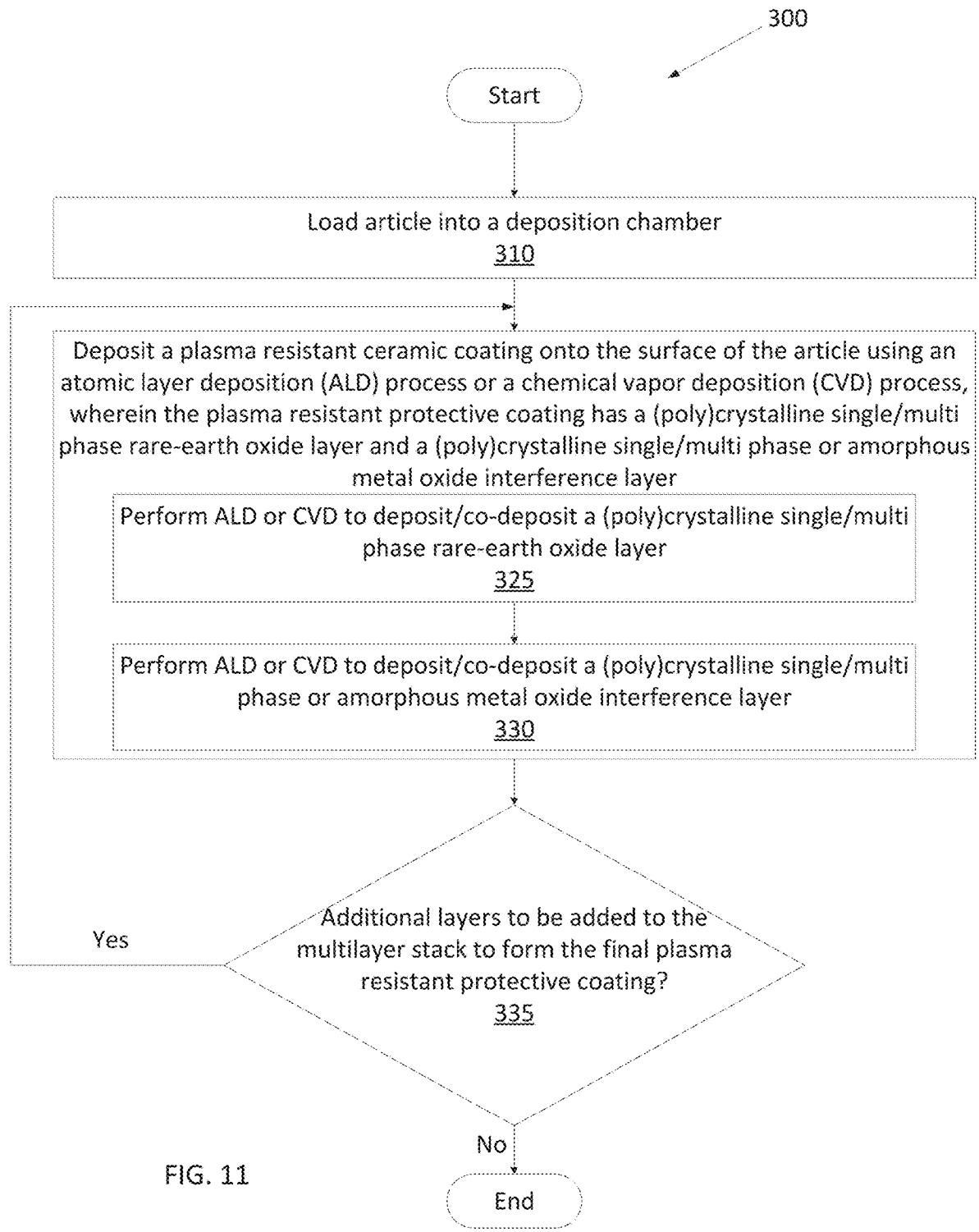
FIG. 11 illustrates a method for creating a plasma resistant protective coating using atomic layer deposition or chemical vapor deposition as described herein.

FIG. 11 illustrates a method 300 for forming a plasma resistant protective coating comprising a rare-earth oxide layer and a metal oxide interruption layer on an article such as a process chamber component according to embodiments. Method 300 may be used to coat any articles including articles having aspect ratios of about 3:1 to about 300:1 (e.g., aspect ratios of 20:1, 50:1, 100:1, 150:1, and so on). The method may optionally begin by selecting a composition for the rare-earth oxide layer and for the metal oxide interruption layer of the plasma resistant protective coating and by selecting a thickness for each of these layers. The composition of the rare-earth oxide layer and the composition of the metal oxide interruption layer may be selected from any of the materials contemplated hereinabove. The thickness selected for the rare-earth oxide layer and for the metal oxide interruption layer and the ratio among them may also be selected from any of the thicknesses and ratios contemplated hereinabove. The composition selection, thickness selection, and method of forming may be performed by the same entity or by multiple entities.

At block 310, the article is loaded into an ALD or a CVD deposition chamber. The method comprises depositing a plasma resistant protective coating onto a surface of the article using ALD or CVD. In one embodiment, at block 325 ALD or CVD is performed to deposit or co-deposit (for a multi-elemental layer) a rare-earth oxide layer. The rare-earth oxide layer may comprise yttrium oxide and have a cubic crystalline phase in one embodiment. In one embodiment, at block 330 ALD or CVD is performed to deposit or co-deposit (for a multi-elemental layer) a metal oxide interruption layer. The metal oxide interruption layer may have an atomic crystalline phase different from the cubic phase of the crystalline rare-earth oxide layer. The metal oxide interruption layer may be amorphous.

ALD and CVD are very conformal processes as performed in embodiments, which may cause the surface roughness of the plasma resistant protective coating to match a surface roughness of an underlying surface of the article that is coated. The plasma resistant protective coating may have a total thickness of about 500 nm to about 10 μm or about 500 nm to about 5 μm in some embodiments. In other embodiments, the plasma resistant protective coating may have a thickness of about 500 nm to about 1 μm. The plasma resistant protective coating may have a porosity of about 0% in embodiments, or may be porosity-free in embodiments, and may have a thickness variation across different sections of the coating of about +/−5% or less, +/−10% or less, or +/−20% or less.

At block 335, a determination may be made as to whether additional layers are to be added to the plasma resistant protective coating (e.g., if a multi-layer stack is to be formed). If additional layers are to be added, then the method may return to blocks 325-330 and an additional rare-earth oxide layer and metal oxide interruption layer may be formed via ALD or CVD. Otherwise the plasma resistant protective coating may be fully formed and the method may reach its end.

Depending on the composition of the rare-earth oxide layer, block 325 may comprise one or more cycles of ALD or CVD to deposit a rare-earth oxide with a target thickness. The target thickness of the rare-earth oxide layer may range from 500 angstroms to about 5000 angstroms. In some embodiment, the rare-earth oxide layer may be a multi-elemental rare earth oxide layer. A multi-elemental rare earth oxide layer may be deposited through sequential ALD or CVD deposition or through co-deposition by co-injecting a plurality of precursors simultaneously into a deposition chamber. The various ALD techniques are described in more detail with respect to FIGS. 1A-1C and it is understood that similar mechanisms may be utilized with a CVD process as well.

Similarly, depending on the composition of the metal oxide interruption layer, block 330 may comprise one or more cycles of ALD or CVD to deposit a metal oxide interruption layers with a target thickness. The target thickness of a metal oxide interruption layer may range from about 1 angstrom to about 500 angstroms. In some embodiment, the metal oxide interruption layer may be a multi-elemental metal oxide interruption layer. A multi-elemental metal oxide interruption layer may be deposited through sequential ALD or CVD deposition or through co-deposition by co-injecting a plurality of precursors simultaneously into a deposition chamber. The various ALD techniques are described in more detail with respect to FIGS. 1A-1C and it is understood that similar mechanisms may be utilized with a CVD process as well.

The resistance of the coating material to plasma is measured through "etch rate" (ER), which may have units of micron/hour (μm/hr), throughout the duration of the coated components' operation and exposure to plasma. Measurements may be taken after different processing times. For example, measurements may be taken before processing, after 50 processing hours, after 150 processing hours, after 200 processing hours, and so on. Variations in the composition of the plasma resistant protective coating grown or deposited on the showerhead or on any other process chamber component may result in multiple different plasma resistances or erosion rate values. Additionally, a plasma resistant protective coating with a single composition exposed to various plasmas could have multiple different plasma resistances or erosion rate values. For example, a plasma resistant material may have a first plasma resistance or erosion rate associated with a first type of plasma and a second plasma resistance or erosion rate associated with a second type of plasma. In embodiments, no detectable erosion occurred after exposure to a 200W $NF_3$ direct capacitive coupled plasma at 450° C. for 2 hours.

The following examples are set forth to assist in understanding the embodiments described herein and should not be construed as specifically limiting the embodiments described and claimed herein. Such variations, including the substitution of all equivalents now known or later developed, which would be within the purview of those skilled in the art, and changes in formulation or minor changes in experimental design, are to be considered to fall within the scope of the embodiments incorporated herein. These examples may be achieved by performing method 300 described above.

Figure 5C:
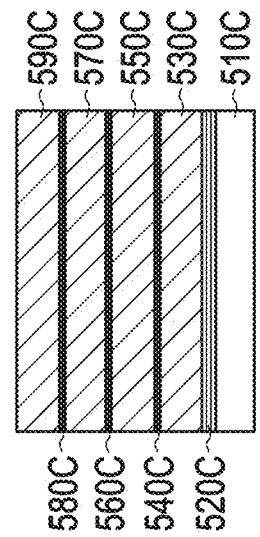
FIGS. 5A, 5B, and 5C depict exemplary plasma resistant protective coatings in accordance with examples 1, 2, and 3 respectively.
Figure 5B:
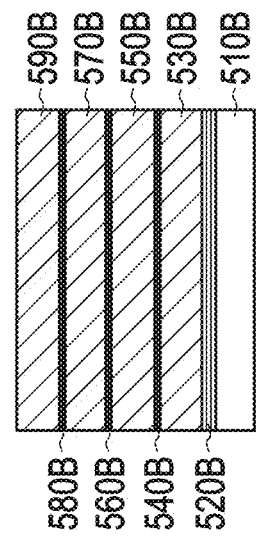
Figure 5A:
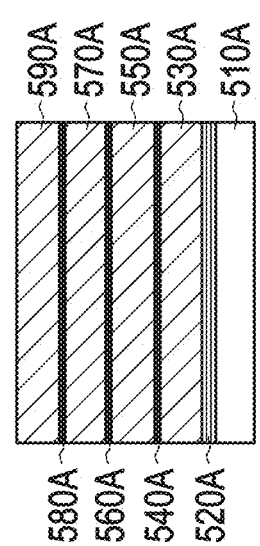

Example 1— Forming a $Y_2O_3$ Plasma Resistant Protective Coating on an Al 6061 Substrate and $Al_2O_3$ Buffer Layer with Intermittent $ZrO_2$ Interruption Layers FIG. 5A depicts a plasma resistant protective coating deposited on an $Al_2O_3$ buffer layer 520A that is deposited on an aluminum substrate of Al 6061 510A. A rare-earth oxide layer 530A of crystalline yttrium oxide was deposited on the aluminum oxide buffer layer using atomic layer deposition. The deposition of the crystalline yttrium oxide layer occurred by injecting a yttrium-containing precursor into the deposition chamber containing the article to cause the yttrium-containing precursor to adsorb onto the surface of the article to form a first half reaction. Thereafter, an oxygen-containing reactant may have been injected into the deposition chamber to form a second half-reaction. This deposition cycle may have been repeated until the target thickness was obtained.

Subsequently, an interruption layer 540A of multiphase crystalline zirconium oxide layer was deposited on the single phase crystalline yttrium oxide layer using atomic layer deposition. The deposition of the multiphase crystalline zirconium oxide layer occurred by injecting a metal-containing precursor (e.g., zirconium-containing precursor) into the deposition chamber containing the article to cause the metal-containing precursor (e.g., zirconium-containing precursor) to adsorb onto the surface of the article to form a first half reaction. Thereafter, an oxygen-containing reactant may have been injected into the deposition chamber to form a second half-reaction. This deposition cycle may have been repeated until the target thickness was obtained.

These depositions were repeated for several cycles to form a stack of alternating layers of single phase crystalline yttrium oxide layers (530A, 550A, 570A, 590A) and multiphase crystalline zirconium oxide layers (540A, 560A, 580A).

Figure 6A:
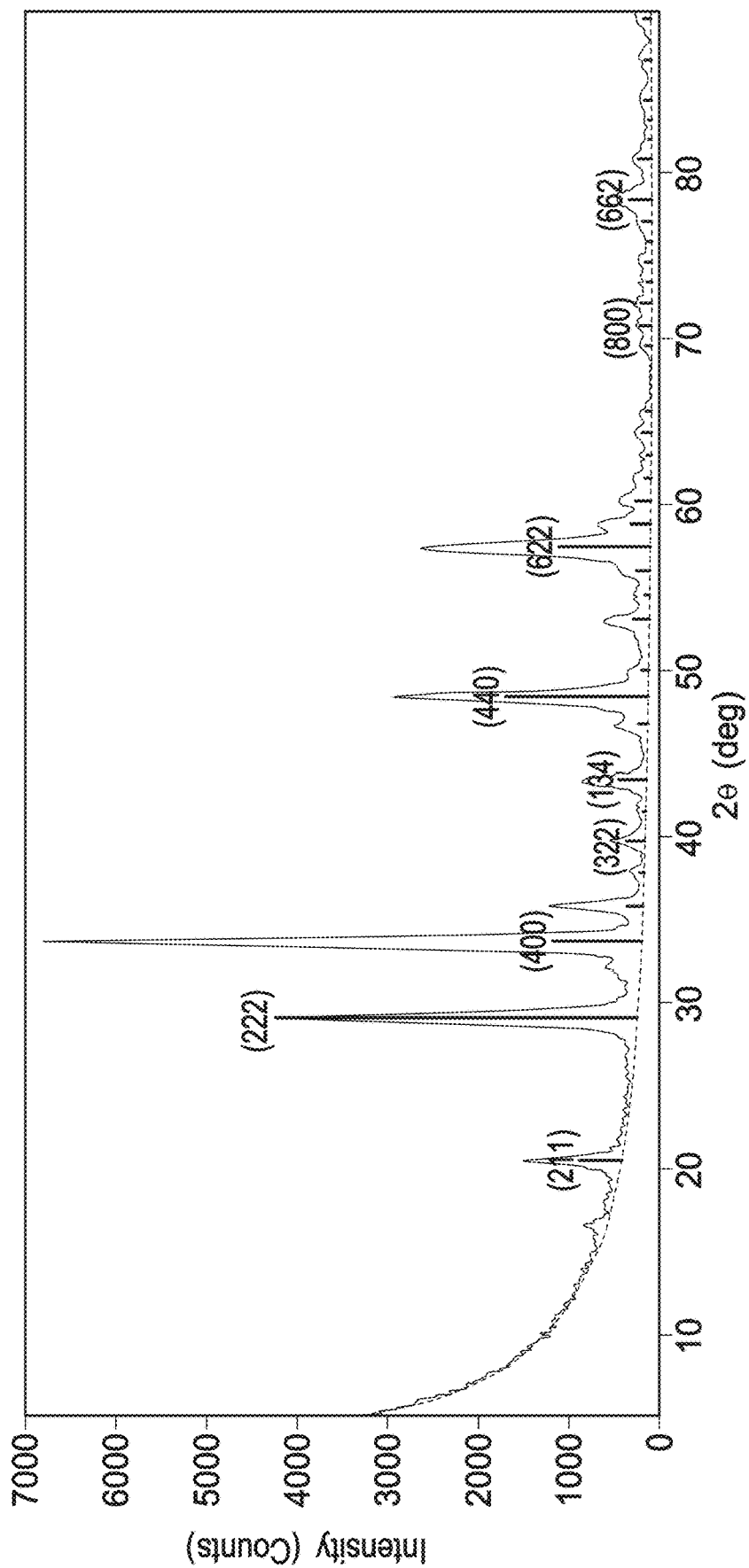
FIG. 6A depicts an X-Ray Diffraction (XRD) profile of a cubic yttrium oxide having a Powder Diffraction File (PDF) No. 04-005-4378.

The first layer 530A in the plasma resistant protective coating was a single phase crystalline yttrium oxide layer. The crystalline yttrium oxide layers had about 95-100 wt % cubic phase corresponding to a Powder Diffraction File (PDF) No. 04-005-4378. The single phase crystalline yttrium oxide layers demonstrated an X-Ray Diffraction (XRD) profile as depicted in FIG. 6A.

Figure 6B:
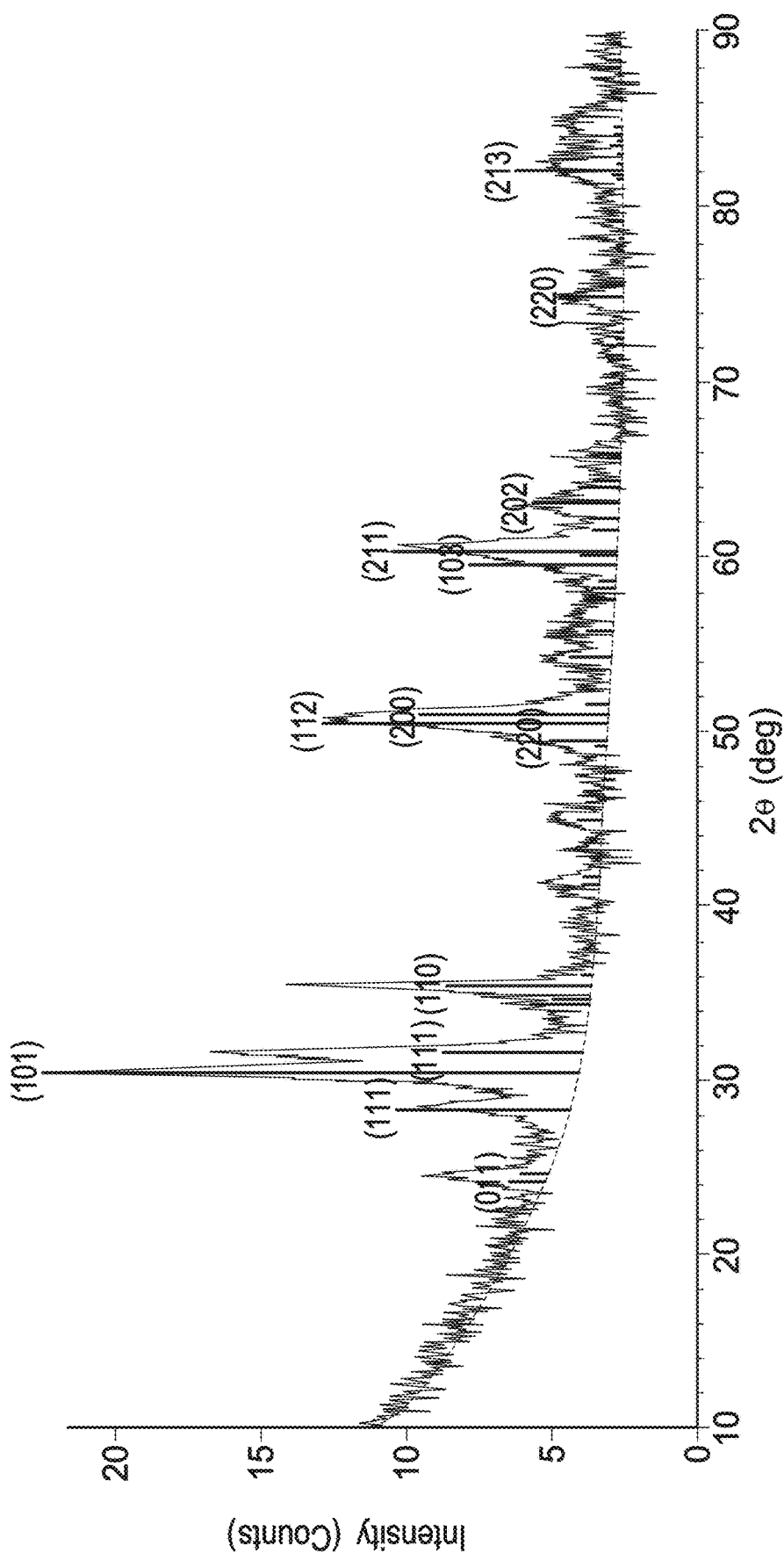
FIG. 6B depicts an XRD profile of a multiphase mixture of a tetragonal zirconia and monoclinic zirconia as present in the interruption layers of example 1.

The intermittent zirconium oxide layers in the plasma resistant protective coating were multiphase crystalline with about 65.1±5 wt % of a tetragonal crystalline phase (also referred to as Tazheranite) and about 34.9±5 wt % of a monoclinic crystalline phase (also referred to as Baddeleyite). The tetragonal crystalline phase of zirconia corresponds to a PDF No. 01-070-8758. The monoclinic crystalline phase of zirconia corresponds to a PDF No. 01-070-8739. The multiphase crystalline zirconium oxide layers demonstrated an XRD profile as depicted in FIG. 6B.

The thickness of the each of the rare earth oxide layers (i.e., the crystalline yttrium oxide layers) was about 240 nm to about 260 nm and the thickness of the interruption layers (i.e., the multiphase crystalline zirconium oxide layers) was about 0.5 nm to about 1.5 nm.

Figure 6C:
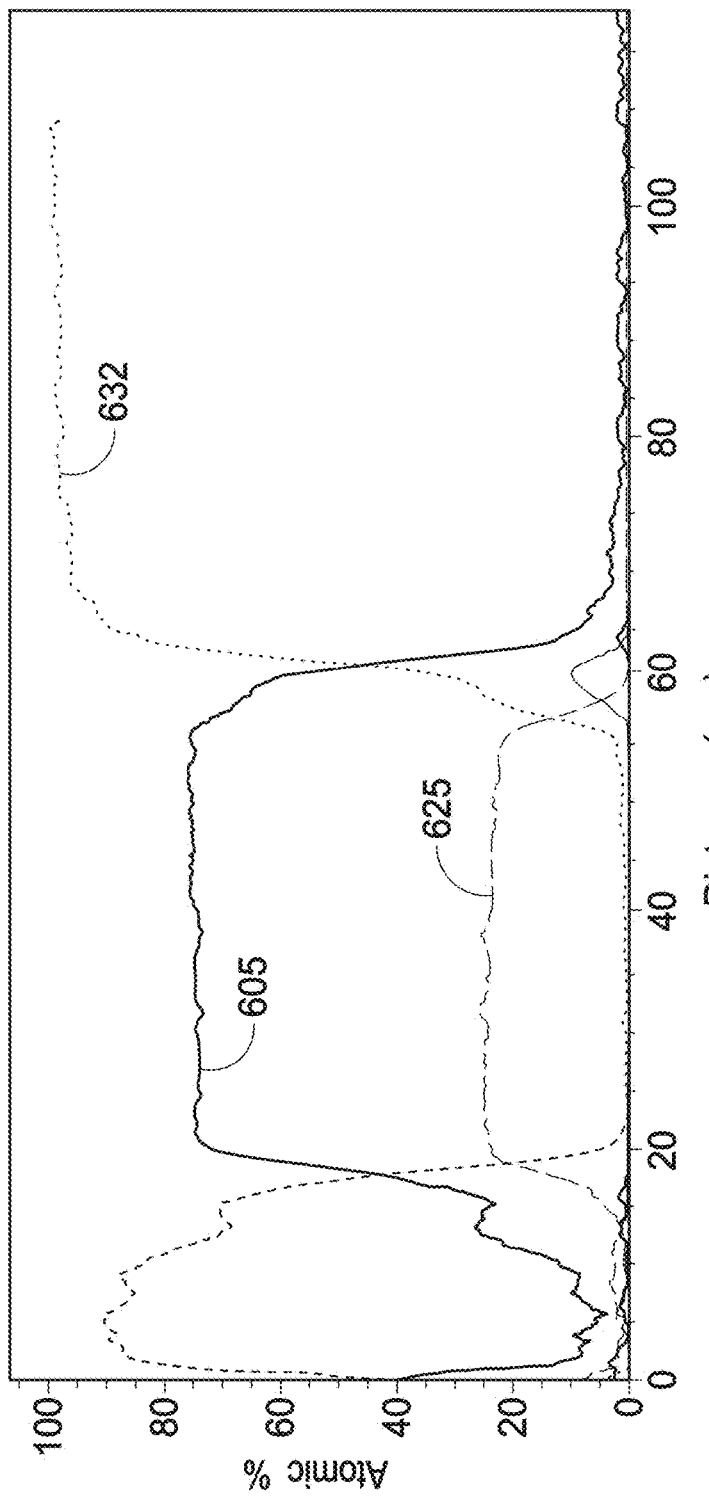
FIG. 6C depicts a transmission electron microscopy and energy dispersive spectroscopy (TEM/EDS) line scan of a multiphase mixture of a tetragonal zirconia and monoclinic zirconia as present in the interruption layers of example 1.

The zirconium oxide interruption layers in the plasma resistant protective coating were characterized using inter alia Transmission Electron Microscopy and Energy Dispersive Spectroscopy (TEM/EDS) line scan. For analysis via TEM/EDS, the interruption layer of multiphase crystalline zirconium oxide was deposited with a thickness that was sufficient to generate the atomic distribution of the various atoms in the layer. The line scan is depicted in FIG. 6C. Concentrations of oxygen 605, zirconium 625, and aluminum 632 are called out. The composition demonstrated between 20 nm and 60 nm in the line scan corresponds to the composition of the multiphase crystalline zirconium oxide interruption layer. FIG. 6C illustrates that the multiphase crystalline zirconium oxide interruption layer comprises about 25 atomic % of zirconium and about 75 atomic % of oxygen.

Figure 6D:
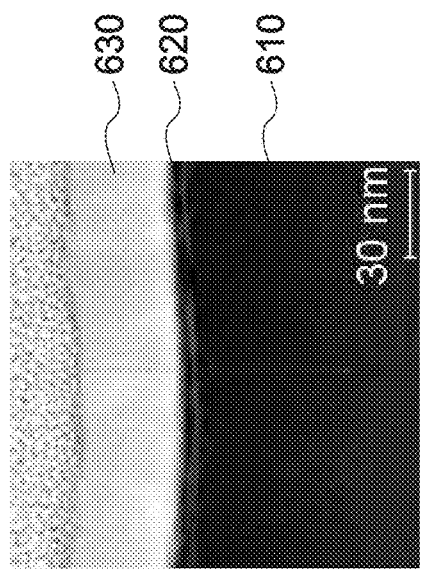
FIG. 6D depicts a high Angle Annular Dark Field (HAADF) Scanning Transmission Electron Microscopy (STEM) image of a multiphase mixture of a tetragonal zirconia and monoclinic zirconia as present in the interruption layers of example 1.

FIG. 6D depicts a high Angle Annular Dark Field (HAADF) Scanning Transmission Electron Microscopy (STEM) image of the multiphase crystalline zirconium oxide interruption layer that was analyzed via TEM/EDS in FIG. 6C. Region 610 depicts Al6061, region 620 depicts the alumina buffer layer, and region 630 depicts the exemplary multiphase crystalline zirconium oxide interruption layer that was analyzed via TEM/EDS in FIG. 6C. FIG. 6D also shows that the multiphase crystalline zirconium oxide layer deposited by ALD covers the Al6061 and alumina buffer layer conformally and uniformly with low to no porosity.

Example 2— Forming a $Y_2O_3$ Plasma Resistant Protective Coating on an Al 6061 Substrate and $Al_2O_3$ Buffer Layer with Intermittent $Y_xZr_yO_z$ Interruption Layers FIG. 5B depicts a plasma resistant protective coating deposited on an $Al_2O_3$ buffer layer 520B that is deposited on an aluminum substrate of Al 6061 510B. A rare-earth oxide layer 530B of crystalline yttrium oxide was deposited on the aluminum oxide buffer layer using atomic layer deposition.

Subsequently, an interruption layer 540B of crystalline zirconium yttrium oxide layer (e.g., a solid solution of $Y_2O_3$—$ZrO_2$) was deposited on the crystalline yttrium oxide layer using atomic layer deposition. The crystalline yttrium oxide layer and crystalline zirconium yttrium oxide layer may have been deposited in a manner similar to that described in Example 1.

Interruption layer 540B was deposited through sequential atomic layer deposition. Specifically, one cycle of zirconium oxide was deposited via atomic layer deposition, followed by one cycle of yttrium oxide deposited via atomic layer deposition. These two cycles (one cycle of $ZrO_2$ and one cycle of $Y_2O_3$) will be together referred to as a supercycle. Interruption layer 540B was fully grown after 4 supercycles.

The depositions of the single phase crystalline yttrium oxide layer and single phase crystalline zirconium yttrium oxide interruption layers were repeated for several cycles to form a stack of alternating layers of crystalline yttrium oxide layers (530B, 550B, 570B, 590B) and crystalline zirconium yttrium oxide layers (540B, 560B, 580B).

The first layer 530B in the plasma resistant protective coating was a single phase crystalline yttrium oxide layer. The single phase crystalline yttrium oxide layers had an about 95-100 wt % cubic phase corresponding to a Powder Diffraction File (PDF) No. 04-005-4378. The single phase crystalline yttrium oxide layers demonstrated an X-Ray Diffraction (XRD) profile as depicted in FIG. 6A.

Figure 7A:
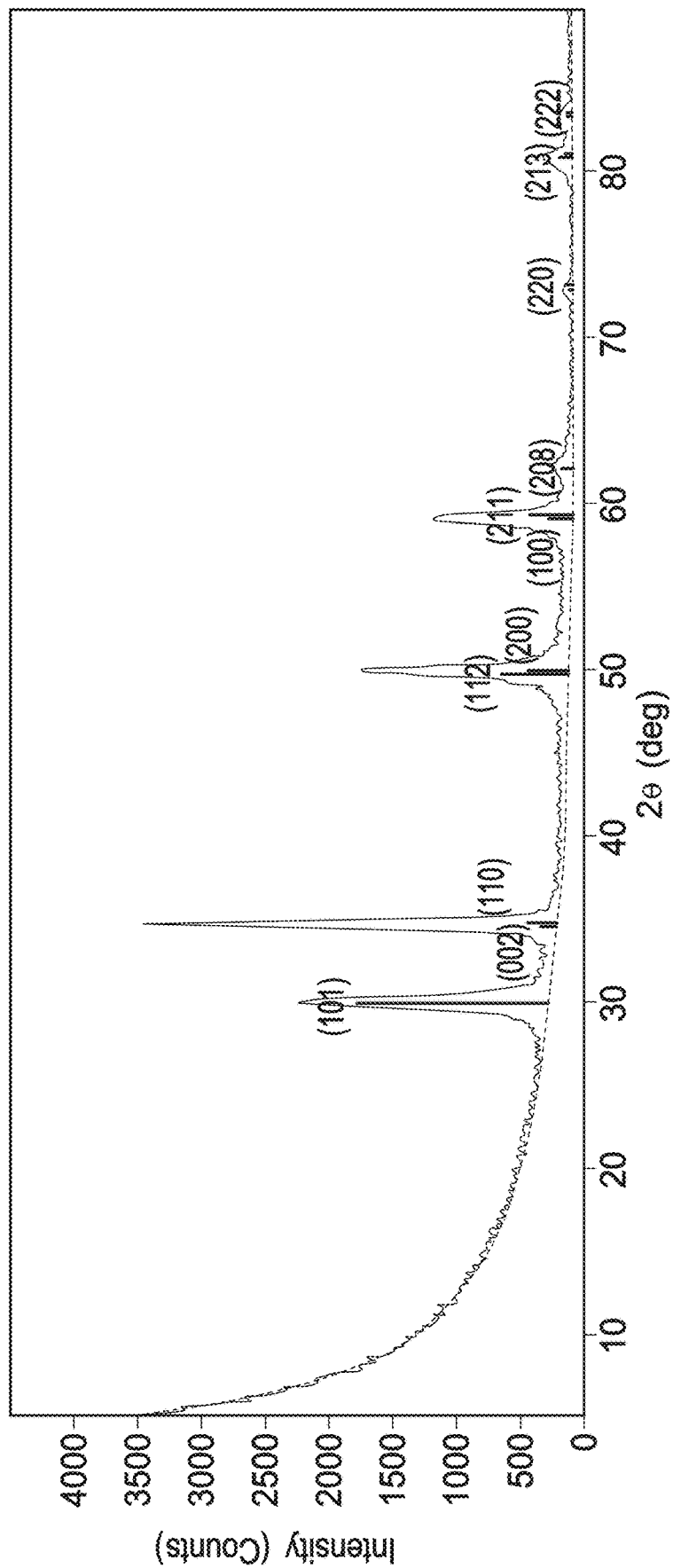
FIG. 7A depicts an XRD profile of a crystalline zirconium yttrium oxide having a chemical formula $Zr_{0.86}Y_{0.14}O_{1.93}$ and a PDF No. 01-082-1243 as present in the interruption layers of example 2.

The intermittent zirconium yttrium oxide layers in the plasma resistant protective coating were single phase crystalline with about 95-100 wt % tetragonal crystalline phase. The tetragonal crystalline phase of zirconium yttrium oxide corresponds to a PDF No. 01-082-1243. The crystalline zirconium yttrium oxide layers demonstrated an XRD profile as depicted in FIG. 7A. The XRD profile depicted in FIG. 7A and the corresponding PDF No. correlate with $Zr_{0.86}Y_{0.14}O_{1.93}$ chemical formula.

The thickness of the each of the rare earth oxide layers (i.e., the crystalline yttrium oxide layers) was about 240 nm to about 260 nm and the thickness of the interruption layers (i.e., the crystalline zirconium yttrium oxide layers) was about 0.5 nm to about 1.5 nm, or about 0.8 nm.

Figure 7B:
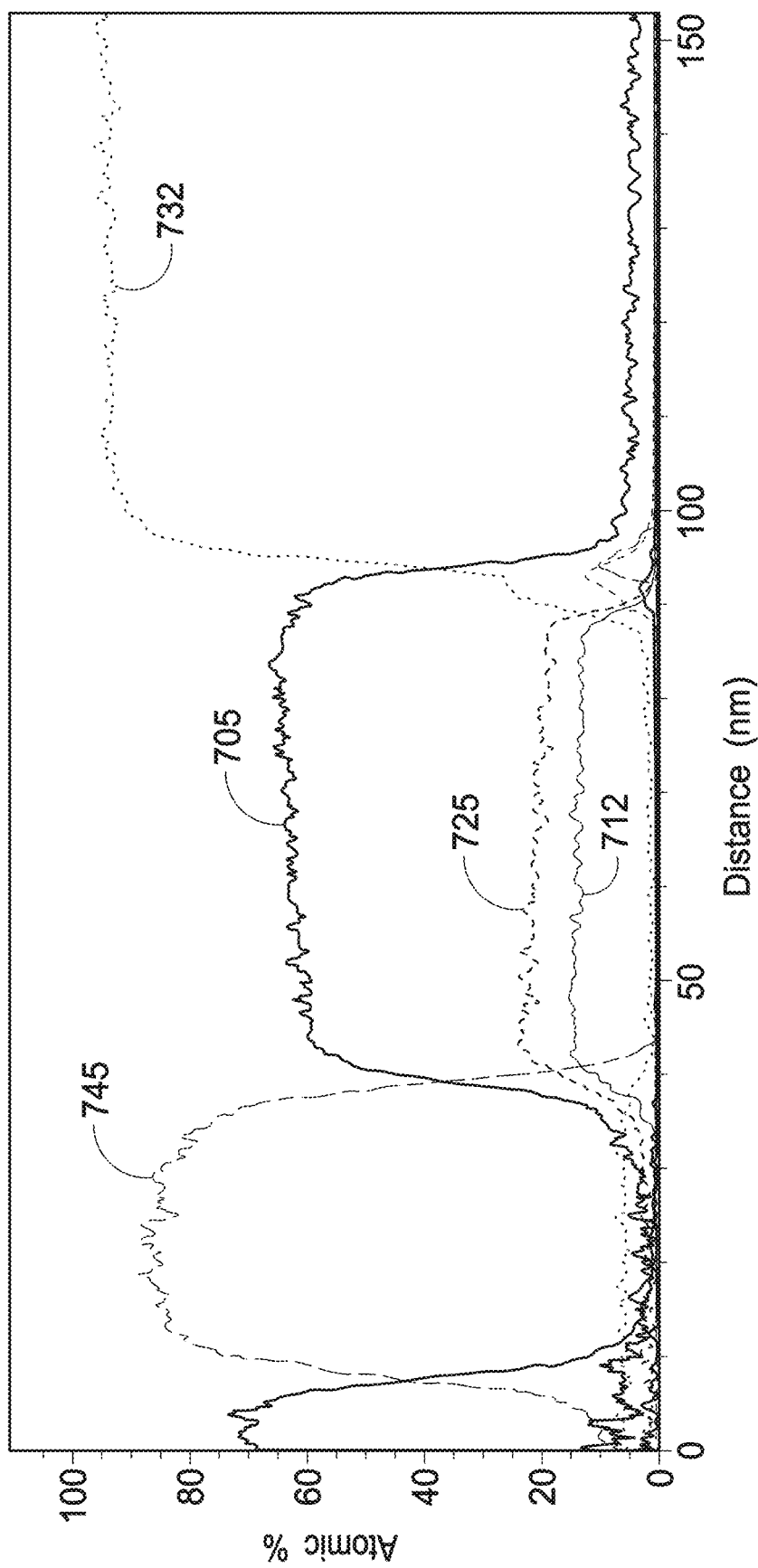
FIG. 7B depicts a TEM/EDS line scan of a crystalline single phase zirconium yttrium oxide having a chemical formula $Zr_{0.86}Y_{0.14}O_{1.93}$ as present in the interruption layers of example 2.

The zirconium yttrium oxide interruption layers in the plasma resistant protective coating were characterized using inter alia Transmission Electron Microscopy and Energy Dispersive Spectroscopy (TEM/EDS) line scan. For analysis via TEM/EDS, the interruption layer of crystalline zirconium yttrium oxide was deposited with a thickness that was sufficient to generate the atomic distribution of the various atoms in the layer. The line scan is depicted in FIG. 7B. Concentrations of oxygen 705, yttrium 712, zirconium 725, aluminum 732, and iridium 745 are called out. The composition demonstrated between 40 nm and 90 nm in the line scan corresponds to the composition of the crystalline zirconium yttrium oxide interruption layer. FIG. 7B illustrates that the crystalline zirconium yttrium oxide interruption layer comprises about 10-15 atomic % of yttrium, about of 20-25 atomic % of zirconium and about 60-65 atomic % of oxygen.

Figure 7C:
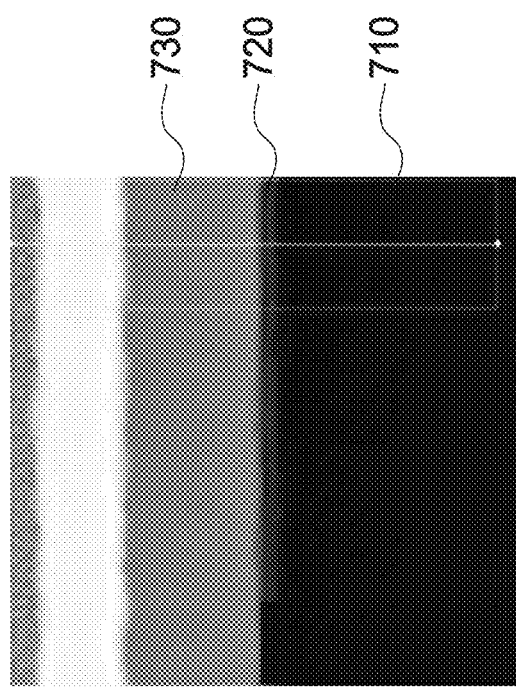
FIG. 7C depicts a HAADF STEM image of a crystalline single phase zirconium yttrium oxide having a chemical formula $Zr_{0.86}Y_{0.14}O_{1.93}$ as present in the interruption layers of example 2.

FIG. 7C depicts a high Angle Annular Dark Field (HAADF) Scanning Transmission Electron Microscopy (STEM) image of the crystalline zirconium yttrium oxide interruption layer that was analyzed via TEM/EDS in FIG. 7B. Region 710 depicts Al6061, region 720 depicts the alumina buffer layer, and region 730 depicts the exemplary multiphase crystalline zirconium oxide interruption layer that was analyzed via TEM/EDS in FIG. 7B. FIG. 7C also shows that the crystalline zirconium yttrium oxide layer deposited by ALD covers the Al6061 and alumina buffer layer conformally and uniformly with low to no porosity.

Figure 7E:
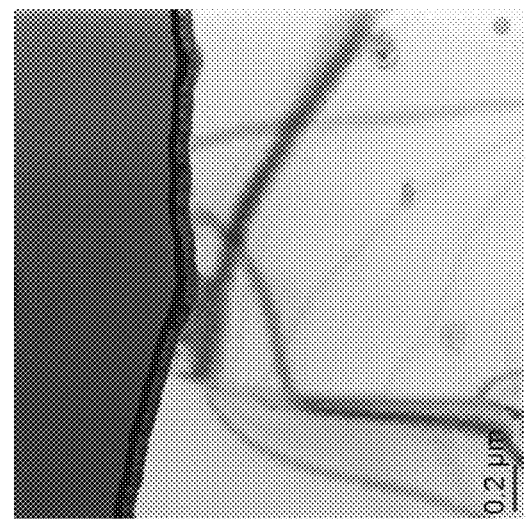
FIGS. 7D and 7E depict a TEM image of various scales (10 nm scale and 0.2 µm scale, respectively) of a crystalline zirconium yttrium oxide having a chemical formula $Zr_{0.86}Y_{0.14}O_{1.93}$ as present in the interruption layers of example 2.
Figure 7D:
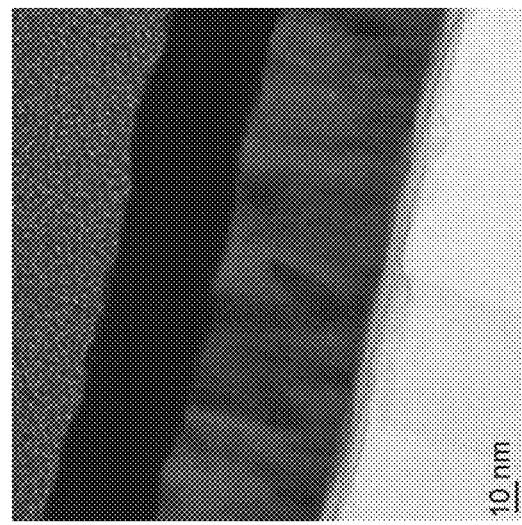

FIGS. 7D and 7E depicts Transmission Electron Microscopy (TEM) images of a crystalline zirconium yttrium oxide layer and further demonstrate the conformal, uniform, and porosity free coating obtained through atomic layer deposition.

Example 3— Forming a $Y_2O_3$ Plasma Resistant Protective Coating on an Al 6061 Substrate and $Al_2O_3$ Buffer Layer with Intermittent $Y_xZr_yO_z$ Interruption Layers FIG. 5C depicts a plasma resistant protective coating deposited on an $Al_2O_3$ buffer layer 520C that is deposited on an aluminum substrate of Al 6061 510C. A rare-earth oxide layer 530C of single phase crystalline yttrium oxide was deposited on the aluminum oxide buffer layer using atomic layer deposition. Subsequently, an interruption layer 540C of a mixed multiphase crystalline yttrium zirconium oxide (e.g., a $Y_2O_3$—$ZrO_2$ solid solution) and yttrium oxide layer was deposited on the single phase crystalline yttrium oxide layer using atomic layer deposition. The single phase crystalline yttrium oxide layer and multiphase crystalline yttrium zirconium oxide interruption layer may have been deposited in a manner similar to that described in Example 1.

Interruption layer 540C was deposited through sequential atomic layer deposition. Specifically, one cycle of zirconium oxide was deposited via atomic layer deposition, followed by two cycles of yttrium oxide deposited via atomic layer deposition. These three cycles (one cycle of $ZrO_2$ and two cycle of $Y_2O_3$) will be together referred to in this example as a supercycle. Interruption layer 540C was fully grown after 4 supercycles.

The depositions of the single phase crystalline yttrium oxide layer and multiphase crystalline mix of yttrium zirconium oxide and yttrium oxide interruption layers were repeated for several cycles to form a stack of alternating layers of single phase crystalline yttrium oxide layers (530C, 550C, 570C, 590C) and multiphase crystalline of yttrium zirconium oxide and yttrium oxide (540C, 560C, 580C).

The first layer 530C in the plasma resistant protective coating was a single phase crystalline yttrium oxide layer. The single phase crystalline yttrium oxide layers had an about 95-100 wt % cubic phase corresponding to a Powder Diffraction File (PDF) No. 04-005-4378. The single phase crystalline yttrium oxide layers demonstrated an X-Ray Diffraction (XRD) profile as depicted in FIG. 6A.

Figure 8A:
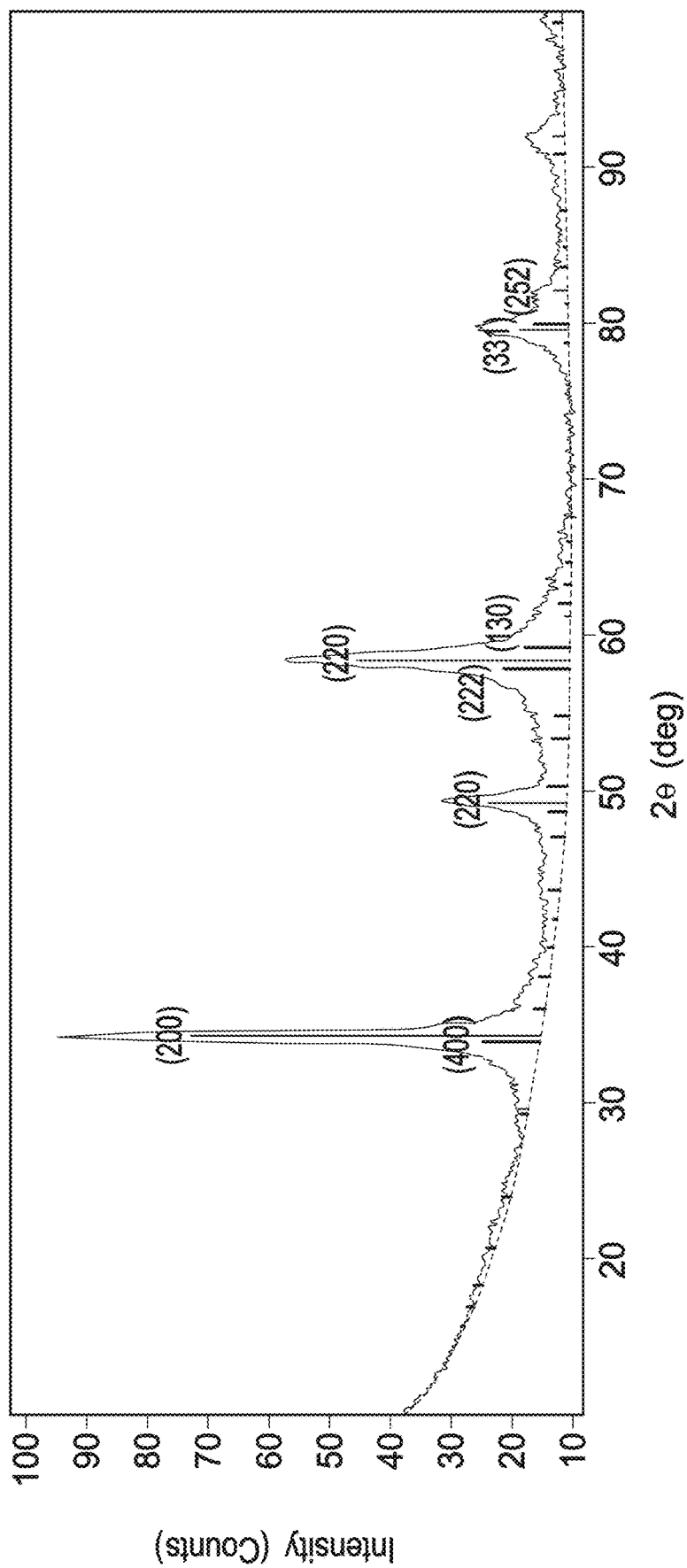
FIG. 8A depicts an XRD profile of a multiphase mix of yttrium zirconium oxide having a chemical formula $Zr_{0.4}Y_{0.6}O_{1.7}$ and a PDF No. 01-080-4014 and of yttrium oxide with a PDF No. 01-084-3893 as present in the interruption layers of example 3.

The intermittent mix of yttrium zirconium oxide and yttrium oxide layers in the plasma resistant protective coating were multiphase crystalline with an about 64-74 wt %, or about 69.4 wt % cubic crystalline phase (corresponding to a PDF No. 01-080-4014) and about 25-35 wt %, or about 30.6 wt % cubic yttrium oxide phase (corresponding to a PDF No. 01-084-3893). The multiphase crystalline interruption layers demonstrated an XRD profile as depicted in FIG. 8A. The XRD profile depicted in FIG. 8A and the corresponding PDF Numbers correlate with about 69.4±5 wt % $Zr_{0.4}Y_{0.6}O_{1.7}$ chemical formula and about 30.6±5 wt % $Y_2O_3$ chemical formula. Although the phases of the yttrium zirconium oxide and yttrium oxide are cubic and the phase of the yttrium oxide rare-earth oxide layer is also cubic, the lattice structure of the various cubic phases are different. Thus, the interruption layer may have the same phase as the rare-earth oxide layer as long as the lattice structure of the two crystalline phases vary.

The thickness of the each of the rare earth oxide layers (i.e., the crystalline yttrium oxide layers) was about 240 nm to about 260 nm and the thickness of the interruption layers (i.e., the multiphase crystalline mix of yttrium zirconium oxide and yttrium oxide layers) was about 0.5 nm to about 1.5 nm, or about 1.2 nm.

Figure 8B:
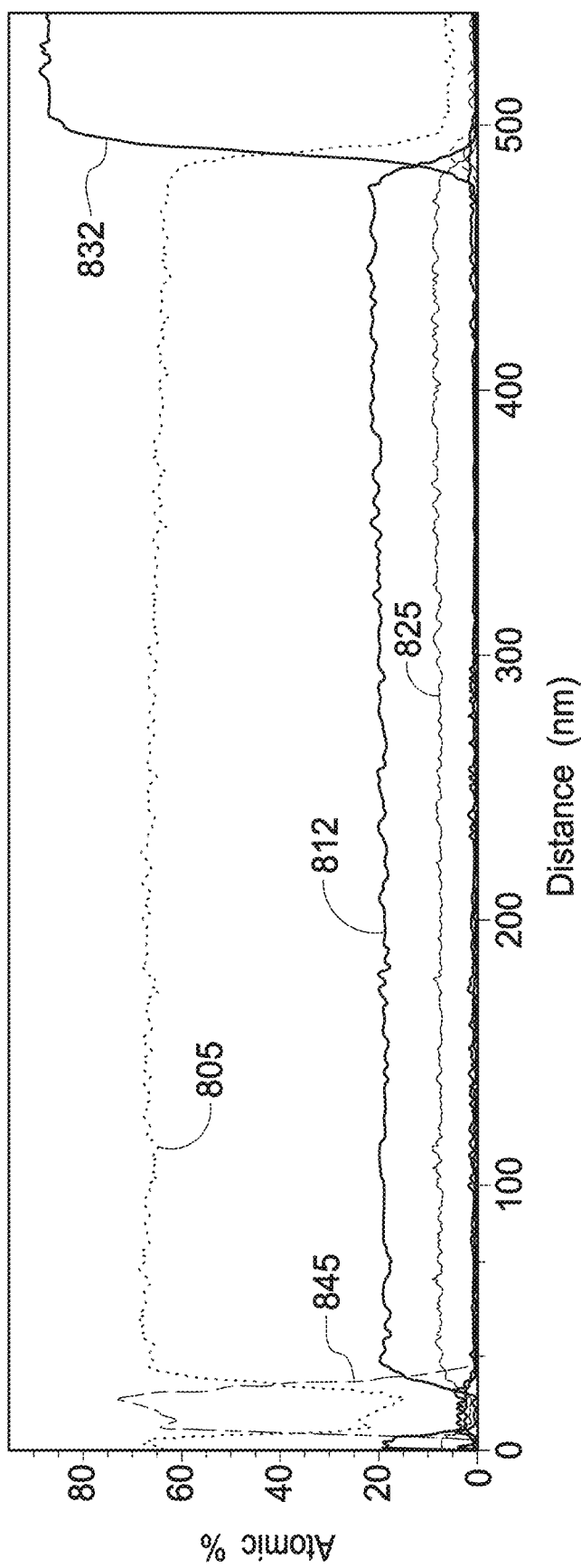
FIG. 8B depicts a TEM/EDS line scan of a multiphase mix of yttrium zirconium oxide having a chemical formula $Zr_{0.4}Y_{0.6}O_{1.7}$ and a PDF No. 01-080-4014 and of yttrium oxide with a PDF No. 01-084-3893 as present in the interruption layers of example 3.

The interruption layers in the plasma resistant protective coating were characterized using inter alia Transmission Electron Microscopy and Energy Dispersive Spectroscopy (TEM/EDS) line scan. For analysis via TEM/EDS, the interruption layer of multiphase crystalline mix of yttrium zirconium oxide and yttrium oxide was deposited with a thickness that was sufficient to generate the atomic distribution of the various atoms in the layer. The line scan is depicted in FIG. 8B. Concentrations of oxygen 805, yttrium 812, zirconium 825, aluminum 832, and iridium 845 are called out. The composition demonstrated between 30 nm and 480 nm in the line scan corresponds to the composition of the multiphase crystalline mix of yttrium zirconium oxide and yttrium oxide interruption layer. FIG. 8B illustrates that the multiphase crystalline mix of yttrium zirconium oxide and yttrium oxide interruption layer comprises about 15-25 atomic % of yttrium, about of 5-10 atomic % of zirconium and about 65-75 atomic % of oxygen.

Figure 8D:
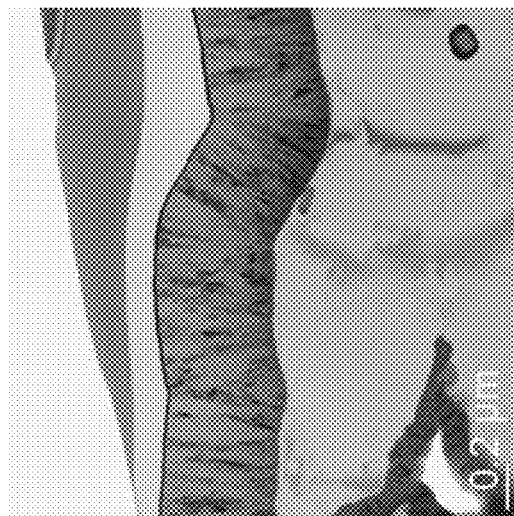
FIG. 8D depicts a 0.2 µm scale TEM image of a multiphase mix of yttrium zirconium oxide having a chemical formula $Zr_{0.4}Y_{0.6}O_{1.7}$ and a PDF No. 01-080-4014 and of yttrium oxide with a PDF No. 01-084-3893 as present in the interruption layers of example 3.
Figure 8C:
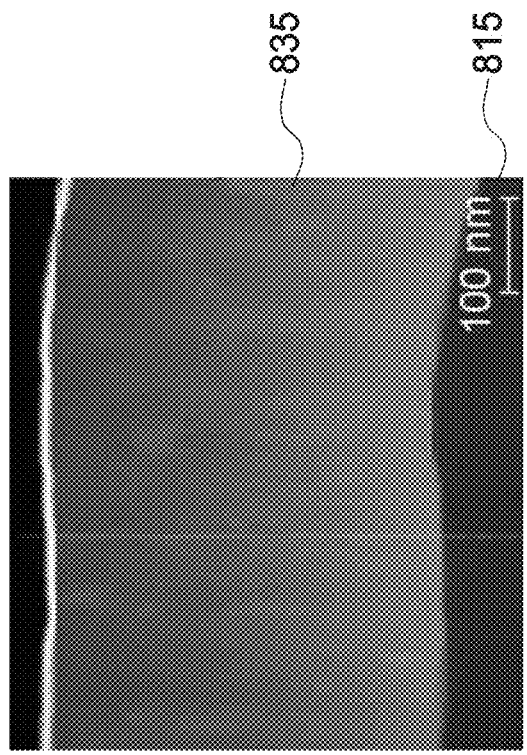
FIG. 8C depicts a HAADF STEM image of a multiphase mix of yttrium zirconium oxide having a chemical formula $Zr_{0.4}Y_{0.6}O_{1.7}$ and a PDF No. 01-080-4014 and of yttrium oxide with a PDF No. 01-084-3893 as present in the interruption layers of example 3.

FIG. 8C depicts a high Angle Annular Dark Field (HAADF) Scanning Transmission Electron Microscopy (STEM) image of the multiphase crystalline mix of yttrium zirconium oxide and yttrium oxide interruption layer that was analyzed via TEM/EDS in FIG. 8B. Region 815 depicts Al6061 and region 835 depicts the exemplary multiphase crystalline mix of yttrium zirconium oxide and yttrium oxide interruption layer that was analyzed via TEM/EDS in FIG. 8B. FIG. 8C also shows that the multiphase crystalline mix of yttrium zirconium oxide and yttrium oxide layer deposited by ALD covers the Al6061 and alumina buffer layer conformally and uniformly with low to no porosity.

FIG. 8D depicts Transmission Electron Microscopy (TEM) images of a multiphase crystalline mix of yttrium zirconium oxide and yttrium oxide interruption layer and further demonstrates the conformal, uniform, and porosity free coating obtained through atomic layer deposition.

Figure 9A:
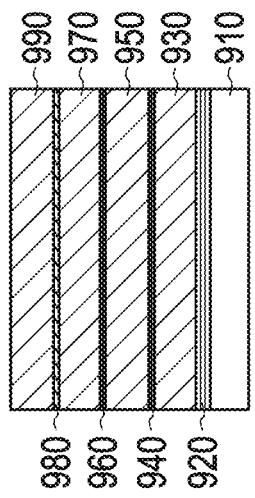
FIG. 9A depicts an exemplary plasma resistant protective coating in accordance with example 4.

Example 4— Forming a $Y_2O_3$ Plasma Resistant Protective Coating on an Al 6061 Substrate and $Al_2O_3$ Buffer Layer with Intermittent $Y_xZr_yO_z$ Interruption Layers FIG. 9A depicts a plasma resistant protective coating deposited on an $Al_2O_3$ buffer layer 920 that is deposited on an aluminum substrate of Al 6061 910. A rare-earth oxide layer 930 of single phase crystalline yttrium oxide was deposited on the aluminum oxide buffer layer using atomic layer deposition. Subsequently, an interruption layer 940 of a mixed multiphase crystalline yttrium zirconium oxide and yttrium oxide layer was deposited on the single phase crystalline yttrium oxide layer using atomic layer deposition. The single phase crystalline yttrium oxide layer and multiphase crystalline yttrium zirconium oxide interruption layer may have been deposited in a manner similar to that described in Example 1.

Interruption layer 940 was deposited through sequential atomic layer deposition. Specifically, one cycle of zirconium oxide was deposited via atomic layer deposition, followed by three cycles of yttrium oxide deposited via atomic layer deposition. These four cycles (one cycle of $ZrO_2$ and three cycle of $Y_2O_3$) will be together referred to in this example as a supercycle. Interruption layer 940 was fully grown after 4 supercycles.

The depositions of the single phase crystalline yttrium oxide layer and multiphase crystalline mix of yttrium zirconium oxide and yttrium oxide interruption layers were repeated for several cycles to form a stack of alternating layers of single phase crystalline yttrium oxide layers (930, 950, 970, 990) and multiphase crystalline mix of yttrium zirconium oxide and yttrium oxide layers (940, 960, 980).

The first layer 930 in the plasma resistant protective coating was a single phase crystalline yttrium oxide layer. The single phase crystalline yttrium oxide layers had an about 95-100 wt % cubic phase corresponding to a Powder Diffraction File (PDF) No. 04-005-4378. The single phase crystalline yttrium oxide layers demonstrated an X-Ray Diffraction (XRD) profile as depicted in FIG. 6A.

The intermittent mix of yttrium zirconium oxide and yttrium oxide layers in the plasma resistant protective coating were multiphase crystalline with an about 25-35 wt %, or about 30.8 wt % cubic crystalline phase (corresponding to a PDF No. 01-080-4014) and about 64-74 wt %, or about 69.2 wt % cubic yttrium oxide phase (corresponding to a PDF No. 01-084-3893). The multiphase crystalline interruption layers demonstrated an XRD profile as depicted in FIG. 8A. The XRD profile depicted in FIG. 8A and the corresponding PDF Numbers correlate with about 30.8±5 wt % $Zr_{0.4}Y_{0.6}O_{1.7}$ (i.e., x is 0.6, y is 0.4, and z is 1.7) is chemical formula and about 69.2±5 wt % $Y_2O_3$ chemical formula. Although the phases of the yttrium zirconium oxide and yttrium oxide are cubic and the phase of the yttrium oxide rare-earth oxide layer is also cubic, the lattice structure of the various cubic phases are different. Thus, the interruption layer may have the same phase as the rare-earth oxide layer as long as the lattice structure of the two crystalline phases vary.

Although x, y, and z in the chemical formula $Y_xZr_yO_z$ are identified in this example and in the prior example, their values should not be construed as limited and the atomic ratio of yttrium to zirconium can range from 0 (when no yttrium is present) to 9, so long as the resultant crystalline phase(s) is/are different from the crystalline phase(s) of the rare-earth oxide layer.

The thickness of the each of the rare earth oxide layers (i.e., the crystalline yttrium oxide layers) was about 240 nm to about 260 nm and the thickness of the interruption layers (i.e., the multiphase crystalline mix of yttrium zirconium oxide and yttrium oxide layers) was about 0.5 nm to about 2.0 nm, or about 1.6 nm.

Figure 9B:
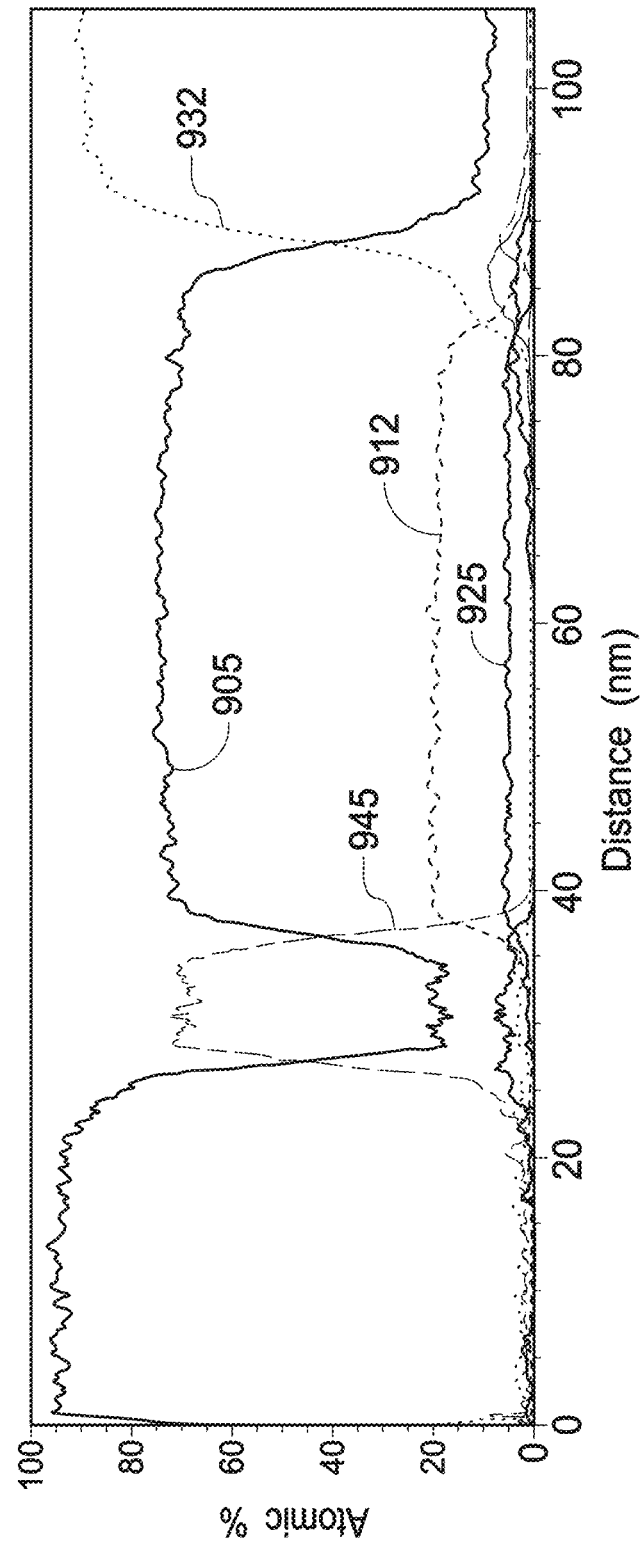
FIG. 9B depicts a TEM/EDS line scan of a multiphase mix of yttrium zirconium oxide having a chemical formula $Zr_{0.4}Y_{0.6}O_{1.7}$ and a PDF No. 01-080-4014 and of yttrium oxide with a PDF No. 01-084-3893 as present in the interruption layers of example 4.

The interruption layers in the plasma resistant protective coating were characterized using inter alia Transmission Electron Microscopy and Energy Dispersive Spectroscopy (TEM/EDS) line scan. For analysis via TEM/EDS, the interruption layer of multiphase crystalline mix of yttrium zirconium oxide and yttrium oxide was deposited with a thickness that was sufficient to generate the atomic distribution of the various atoms in the layer. The line scan is depicted in FIG. 9B. Concentrations of oxygen 905, yttrium 912, zirconium 925, aluminum 932, and iridium 945 are called out. The composition demonstrated between 40 nm and 85 nm in the line scan corresponds to the composition of the multiphase crystalline mix of yttrium zirconium oxide and yttrium oxide interruption layer. FIG. 9B illustrates that the multiphase crystalline mix of yttrium zirconium oxide and yttrium oxide interruption layer comprises about 3-7 atomic % of zirconium, about of 15-25 atomic % of zirconium and about 65-75 atomic % of oxygen.

Figure 9D:
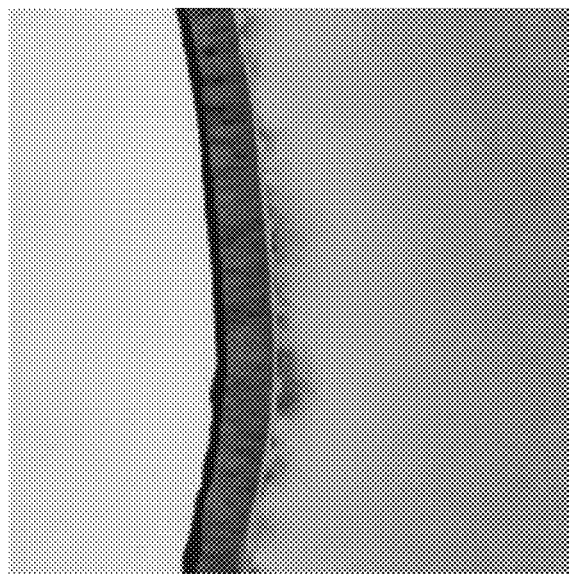
FIG. 9D depicts a 50 nm scale TEM image of a multiphase mix of yttrium zirconium oxide having a chemical formula $Zr_{0.4}Y_{0.6}O_{1.7}$ and a PDF No. 01-080-4014 and of yttrium oxide with a PDF No. 01-084-3893 as present in the interruption layers of example 4.
Figure 9C:
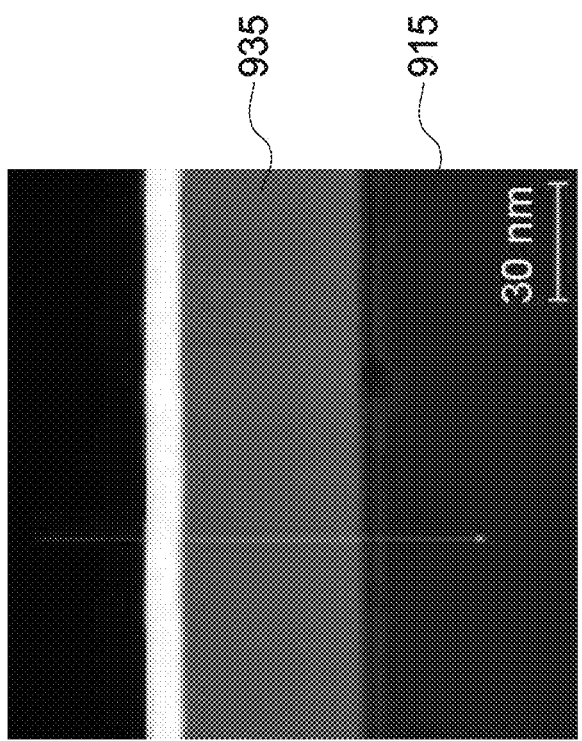
FIG. 9C depicts a HAADF STEM image of a multiphase mix of yttrium zirconium oxide having a chemical formula $Zr_{0.4}Y_{0.6}O_{1.7}$ and a PDF No. 01-080-4014 and of yttrium oxide with a PDF No. 01-084-3893 as present in the interruption layers of example 4.

FIG. 9C depicts a high Angle Annular Dark Field (HAADF) Scanning Transmission Electron Microscopy (STEM) image of the multiphase crystalline mix of yttrium zirconium oxide and yttrium oxide interruption layer that was analyzed via TEM/EDS in FIG. 9B. Region 915 depicts Al6061 and region 935 depicts the exemplary multiphase crystalline mix of yttrium zirconium oxide and yttrium oxide interruption layer that was analyzed via TEM/EDS in FIG. 9B. FIG. 9C also shows that the multiphase crystalline mix of yttrium zirconium oxide and yttrium oxide layer deposited by ALD covers the Al6061 and alumina buffer layer conformally and uniformly with low to no porosity.

FIG. 9D depicts Transmission Electron Microscopy (TEM) images of a multiphase crystalline mix of yttrium zirconium oxide and yttrium oxide interruption layer and further demonstrates the conformal, uniform, and porosity free coating obtained through atomic layer deposition.

Example 5— Forming a $Y_2O_3$ Plasma Resistant Protective Coating on an Al 6061 Substrate and $Al_2O_3$ Buffer Layer with Intermittent Gadolinium Oxide Interruption Layers FIG. 10 depicts a plasma resistant protective coating deposited on an $Al_2O_3$ buffer layer 1020 that is deposited on an aluminum substrate of Al 6061 1010. A rare-earth oxide layer 1030 of single phase crystalline yttrium oxide was deposited on the aluminum oxide buffer layer using atomic layer deposition. Subsequently, an interruption layer 1040 of gadolinium oxide was deposited on the single phase crystalline yttrium oxide layer using atomic layer deposition.

The depositions of the single phase crystalline yttrium oxide layer and single/multi-phase crystalline gadolinium oxide interruption layers were repeated for several cycles to form a stack of alternating layers of crystalline yttrium oxide layers (1030, 1050, 1070, 1090) and of crystalline gadolinium oxide layers (1040, 1060, 1080).

Similar to the crystalline gadolinium oxide interruption layers, other amorphous or crystalline rare-earth oxide interruption layers may be deposited between layers yttrium oxide. When the interruption layer is crystalline, the atomic crystalline phase(s) of the interruption layer should be different from the atomic crystalline phase of the yttrium oxide or at least have a different lattice structure. Dissimilar crystalline phases or dissimilar lattice structures allow the interruption layers to inhibit the growth of the yttrium oxide grains from growing uncontrollably and abnormally large.

Exemplary, non-limiting, crystalline phases associated with various rare-earth oxides are depicted in FIG. 3 (e.g., $La_2O_3$, $Pr_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $ZrO_2$, and combinations thereof). In FIG. 3, where the y axis represents temperature and the x axis represents the rare-earth oxide, it is possible to identify what crystalline single phase or multiphase phase a particular rare-earth oxide will exist in when subjected to a particular temperature. For instance, at certain ALD temperatures $La_2O_3$, $Pr_2O_3$, $Nd_2O_3$ may have a hexagonal crystalline atomic phase; $Sm_2O_3$ may have a hexagonal and/or a monoclinic crystalline phase; $Eu_2O_3$, $Gd_2O_3$, $Tb_2O_3$ may exist in a monoclinic crystalline phase; $Dy_2O_3$ may exist in a monoclinic and/or cubic crystalline phase; and $Ho_2O_3$, $Er_2O_3$, $Tm_2O_3$, $Yb_2O_3$ may exist in a cubic crystalline phase. In some embodiments, the crystalline metal oxide layer may comprise YAG in the cubic phase. As shown, region A includes a rare earth oxide type A structure, which is a hexagonal crystal structure. Region B includes a rare earth oxide type B structure, which is a monoclinic crystal structure. Region C includes a rare earth oxide type C structure, which is a cubic crystal structure. Region H incudes a rare earth type H structure, which is a hexagonal crystal structure. Region X includes a rare earth oxide type X structure, which is a cubic crystal structure. As shown, $Er_2O_3$ possesses a cubic structure.

Figure 12:
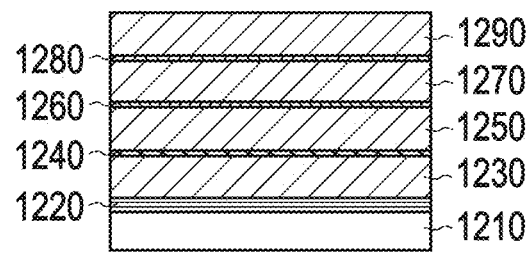
FIG. 12 depicts an exemplary plasma resistant protective coating in accordance with example 6.

Example 6— Forming a $Y_2O_3$ Plasma Resistant Protective Coating on an Al 6061 Substrate and $Al_2O_3$ Buffer Layer with Intermittent $Y_xZr_yO_z$ Interruption Layers FIG. 12 depicts a plasma resistant protective coating deposited on an $Al_2O_3$ buffer layer 1220 that is deposited on an aluminum substrate of Al 6061 1210. A rare-earth oxide layer 1230 of single phase crystalline yttrium oxide was deposited on the aluminum oxide buffer layer using atomic layer deposition. Subsequently, an interruption layer 1240 of yttrium zirconium oxide was deposited on the single phase crystalline yttrium oxide layer using atomic layer deposition. The single phase crystalline yttrium oxide layer and yttrium zirconium oxide interruption layer may have been deposited in a manner similar to that described in Example 1.

Interruption layer 1240 was deposited through sequential atomic layer deposition. Specifically, three cycles of zirconium oxide was deposited via atomic layer deposition, followed by one cycle of yttrium oxide deposited via atomic layer deposition. These four cycles (three cycles of $ZrO_2$ and one cycle of $Y_2O_3$) will be together referred to in this example as a supercycle. Interruption layer 1240 was fully grown after 4 supercycles.

The depositions of the single phase crystalline yttrium oxide layer and yttrium zirconium oxide interruption layers were repeated for several cycles to form a stack of alternating layers of single phase crystalline yttrium oxide layers (1230, 1250, 1270, 1290) and yttrium zirconium oxide (1240, 1260, 1280).

The first layer 1230 in the plasma resistant protective coating was a single phase crystalline yttrium oxide layer. The single phase crystalline yttrium oxide layers had an about 95-100 wt % cubic phase corresponding to a Powder Diffraction File (PDF) No. 04-005-4378. The single phase crystalline yttrium oxide layers demonstrated an X-Ray Diffraction (XRD) profile as depicted in FIG. 6A.

The thickness of the each of the rare earth oxide layers (i.e., the crystalline yttrium oxide layers) was about 240 nm to about 260 nm and the thickness of the interruption layers was about 0.5 nm to about 2.0 nm, or about 1.6 nm.

The interruption layers in the plasma resistant protective coating were characterized using inter alia top down Scanning Electron Microscopy (SEM) image, TEM image, and TEM/EDS line scan.

Figure 13A:
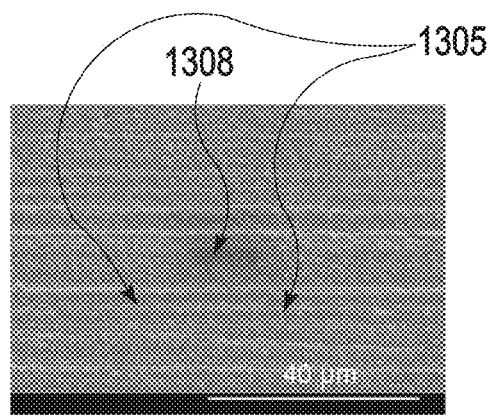
FIG. 13A depicts a top down SEM image of a 1 µm yttria coating deposited by ALD without an interruption layer.
Figure 13B:
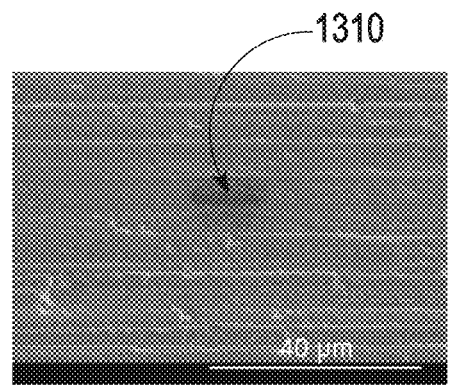
FIG. 13B depicts a top down SEM image of a 1 µm yttria coating with interruption layers in accordance with example 6.

The top down SEM images are depicted in FIG. 13A and FIG. 13B. FIG. 13A shows a top down SEM image of a 1 μm yttria coating deposited by ALD without an interruption layer. As shown in FIG. 13A, overgrown grains 1305 protrude out of the surface coating. Region 1308 shows a cut location (e.g., a focused ion beam (FIB) cut location) for TEM. FIG. 13B shows a top down SEM image of a 1 μm yttria coating with interruption layers in accordance with the instant example. As shown in FIG. 13B, no overgrown grains protrude from the surface of the coating. Region 1310 shows a cut location (e.g., a focused ion beam (FIB) cut location) for TEM.

Figure 14A:
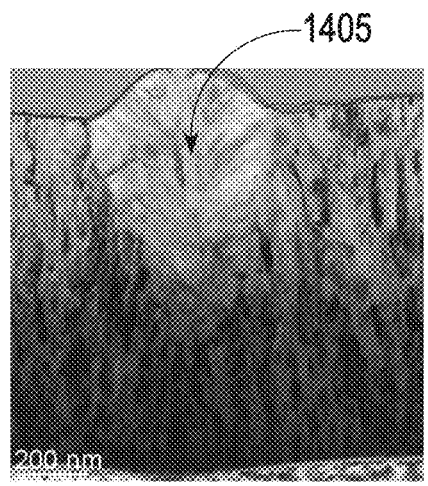
FIG. 14A depicts a cross sectional TEM image of a 1 µm yttria coating deposited by ALD without an interruption layer.
Figure 14B:
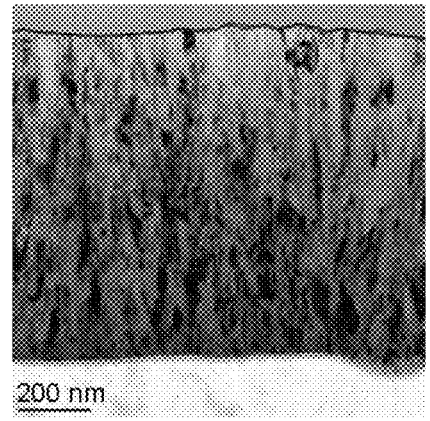
FIG. 14B depicts a cross sectional TEM image of a 1 µm yttria coating with interruption layers in accordance with example 6.

Cross sectional TEM images are depicted in FIG. 14A and FIG. 14B. FIG. 14A shows a cross sectional TEM image of a 1 µm yttria coating deposited by ALD without an interruption layer. FIG. 14A shows a TEM of a sample taken from cut location 1308. As shown in FIG. 14A, an overgrown grain 1405 protrudes out of the surface of the coating. FIG. 14B shows a cross sectional TEM image of a 1 µm yttria coating with interruption layers in accordance with the instant example. FIG. 14B shows a TEM of a sample taken from cut location 1310. As shown in FIG. 14B, no overgrown grains protrude from the surface of the coating.

Figure 15A:
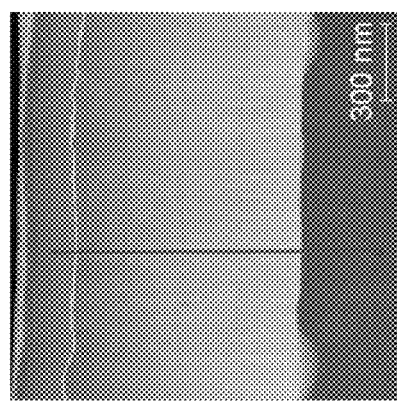
FIG. 15A depicts a TEM/EDS line scan of the plasma resistant protective coating of example 6.
Figure 15B:
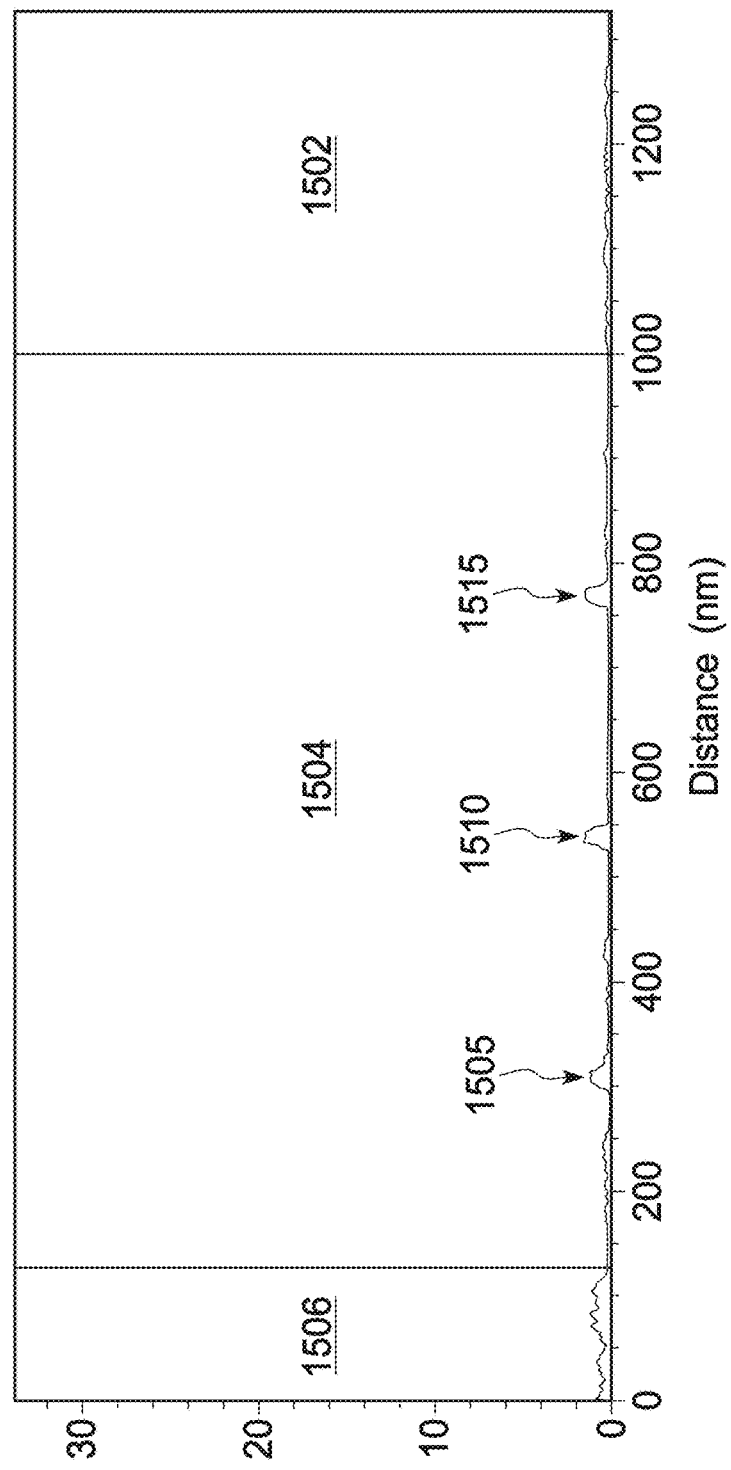
FIG. 15B depicts a TEM image of the plasma resistant protective coating of example 6.

TEM/EDS line scans are depicted in FIG. 15A and FIG. 15B. The line scan is depicted in FIG. 15A. The TEM/EDS line scan shows an Al substrate 1502 covered by a coating 1504, which is in turn covered by a FIB cap layer 1506. The composition demonstrated three zirconium peaks between about 250-350 nm, between about 500-600 nm, and between about 750-850 nm (i.e., in the locations of the interruption layers).

FIG. 15B depicts a TEM image which shows the three interruption layers 1505, 1510, 1515 identified in the line scan (each shown as a zirconium peak) and further demonstrates the conformal, uniform, and porosity free coating obtained through atomic layer deposition.

All interruption layers discussed and exemplified herein only inhibit uncontrolled grain growth of the grains in the crystalline rare-earth oxide layers. The interruption layers do not affect the crystalline phase of the rare-earth oxide layers.

XRD data presented herein was acquired by grazing incidence XRD (GIXRD) on a PANalytical X'Pert Pro MRD 6-axis diffractometer equipped with a copper X-ray tube and parallel beam optics.

TEM samples were prepared using the in situ Focused Ion Beam (FIB) lift out technique on an FEI Helios 650 Dual Beam FIB/SEM. The samples were capped with sputtered Iridium (Ir), protective carbon ink, and e-Pt/I-Pt prior to milling. The TEM lamella thickness was ~100 nm.

TEM samples were imaged with a FEI Tecnai TF-20 FEG/TEM operated at 200 kV in bright-field (BF) TEM mode, high-resolution (HR) TEM mode.

Z-contrast STEM is a form of Rutherford Scattering in which electrons are scattered to very large angles and are collected with a special detector. The scattering goes as Z2 and the resulting image can be directly interpreted as qualitative chemical map. The image contrast is due to differences in the average atomic mass; with heavier atomic masses appearing brighter than lighter average atomic masses. There is typically very little diffraction contrast in these images. These images are sometimes referred to as High Angle Annular Dark Field images (HAADF). "Z Contrast" can show atomic columns in the highest resolution images.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular embodiments may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Reference throughout this specification to numerical ranges should not be construed as limiting and should be understood as encompassing the outer limits of the range as well as each number and/or narrower range within the enumerated numerical range.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A lid for a process chamber, comprising:
    at least one surface comprising a first ceramic material, wherein the first ceramic material comprises $Y_3Al_5O_{12}$, wherein the first ceramic material conformally covers an underlying surface with a uniform thickness having a thickness variation of less than about +/−20%, wherein the first ceramic material is a crystalline single phase material or a crystalline multi-phase material, and wherein the at least one surface comprising the first ceramic material has a porosity of less than 1%; and
    an internal region comprising the underlying surface beneath the at least one surface comprising a second ceramic material, wherein the second ceramic material is a crystalline multi-phase material formed from a combination of $Al_2O_3$ and $ZrO_2$, and wherein the internal region comprising the second ceramic material has a porosity of less than 1%.

2. The lid of claim 1, wherein the second ceramic material has one or more crystalline phases selected from the group consisting of hexagonal, tetragonal, cubic, and monoclinic.

3. The lid of claim 1, wherein the first ceramic material is a crystalline single phase material.

4. The lid of claim 1, wherein the first ceramic material is a crystalline multi-phase material.

5. The lid of claim 1, wherein a first lattice structure of the first ceramic material differs from a second lattice structure of the second ceramic material.

6. The lid of claim 1, wherein the lid comprises a plurality of layers comprising the first ceramic material.

7. The lid of claim 1, wherein the lid comprises a plurality of layers comprising the second ceramic material.

8. The lid of claim 1, wherein the at least one surface comprising the first ceramic material has a porosity of less than about 0.01%.

9. The lid of claim 1, wherein the lid is a ceramic lid.

10. A chamber component for a process chamber, the chamber component comprising:
    at least one surface comprising a first ceramic material, wherein the first ceramic material comprises $Y_3Al_5O_{12}$, wherein the first ceramic material conformally covers an underlying surface with a uniform thickness having a thickness variation of less than about +/−20%, wherein the first ceramic material is a crystalline single phase material or a crystalline multi-phase material, and wherein the at least one surface comprising the first ceramic material has a porosity of less than 1%; and an internal region comprising the underlying surface beneath the at least one surface comprising a second ceramic material, wherein the second ceramic material is a crystalline multi-phase material formed from a combination of $Al_2O_3$ and $ZrO_2$, and wherein the internal region comprising the second ceramic material has a porosity of less than 1%.

11. The chamber component of claim 10, wherein the chamber component is a ceramic chamber component.

12. The chamber component of claim 10, wherein the second ceramic material comprises one or more crystalline phases selected from the group consisting of hexagonal, tetragonal, cubic, and monoclinic.

13. The chamber component of claim 10, wherein the first ceramic material is a crystalline single phase material.

14. The chamber component of claim 10, wherein a first lattice structure of the first ceramic material differs from a second lattice structure of the second ceramic material.

15. The chamber component of claim 10, wherein the chamber component comprises at least one of a) a plurality of layers comprising the first ceramic material or b) a plurality of layers comprising the second ceramic material.

16. The chamber component of claim 10, wherein the at least one surface comprising the first ceramic material has a porosity of less than about 0.01%.

17. The chamber component of claim 10, wherein the first ceramic material is a crystalline multi-phase material.

* * * * *